United States Patent
Suwa et al.

(10) Patent No.: US 11,011,443 B2
(45) Date of Patent: May 18, 2021

(54) POWER SEMICONDUCTOR DEVICE INCLUDING A SPACER

(71) Applicant: HITACHI AUTOMOTIVE SYSTEMS, LTD., Hitachinaka (JP)

(72) Inventors: Tokihito Suwa, Hitachinaka (JP); Seiji Funaba, Hitachinaka (JP)

(73) Assignee: HITACHI AUTOMOTIVE SYSTEMS, LTD., Hitachinaka (JP)

( * ) Notice: Subject to any disclaimer, the term of this patent is extended or adjusted under 35 U.S.C. 154(b) by 81 days.

(21) Appl. No.: 16/066,843

(22) PCT Filed: Dec. 7, 2016

(86) PCT No.: PCT/JP2016/086291
§ 371 (c)(1),
(2) Date: Jun. 28, 2018

(87) PCT Pub. No.: WO2017/119226
PCT Pub. Date: Jul. 13, 2017

(65) Prior Publication Data
US 2019/0006255 A1 Jan. 3, 2019

(30) Foreign Application Priority Data
Jan. 5, 2016 (JP) .............................. JP2016-000327

(51) Int. Cl.
*H01L 23/495* (2006.01)
*H01L 23/29* (2006.01)
(Continued)

(52) U.S. Cl.
CPC .............. *H01L 23/29* (2013.01); *H01L 23/28* (2013.01); *H01L 23/3107* (2013.01);
(Continued)

(58) Field of Classification Search
CPC ............. H01L 21/568; H01L 23/49575; H01L 23/49805
See application file for complete search history.

(56) References Cited

U.S. PATENT DOCUMENTS

| | | | |
|---|---|---|---|
| 2009/0001532 A1 | 1/2009 | Shiomi | |
| 2009/0261462 A1* | 10/2009 | Gomez | .................. H01L 21/568 257/673 |
| 2014/0117522 A1* | 5/2014 | Lim | .................. H01L 23/49575 257/675 |

FOREIGN PATENT DOCUMENTS

| | | |
|---|---|---|
| JP | 2003-031765 A | 1/2003 |
| JP | 2005-064131 A | 3/2005 |

(Continued)

OTHER PUBLICATIONS

International Search Report with English translation and Written Opinion issued in corresponding application No. PCT/JP2016/086291 dated Mar. 7, 2017.

(Continued)

*Primary Examiner* — Thao X Le
*Assistant Examiner* — Geoffrey H Ida
(74) *Attorney, Agent, or Firm* — Foley & Lardner LLP

(57) ABSTRACT

At the time of clamping, excessive stress is applied to bonding parts between substrates and input/output terminals, which may cause the bonding parts to be detached and cause the substrates to be cracked.

A lower electrode of a power semiconductor element 11 is connected via a bonding material 13 to a first interconnection layer 12 arranged on a lower surface of the power semiconductor element 11, and an upper electrode 14 of the power semiconductor element 11 is connected via the bonding material 13 to a second interconnection layer 15 arranged on an upper surface. Also, a second main terminal 16 electrically connected to the upper electrode 14 of the (Continued)

power semiconductor element 11 is connected via the bonding material 13 to the second interconnection layer 15 and contacts and is positioned on a third interconnection layer 24 (spacer) arranged to be parallel to the first interconnection layer 12 on the lower surface. An insulating layer 26 is laminated on a surface of each of the first interconnection layer 12 to the third interconnection layer 24 opposite the bonding material 13, and a heat dissipating layer 27 is laminated on the insulating layer 26.

8 Claims, 23 Drawing Sheets

(51) Int. Cl.
  *H01L 23/31* (2006.01)
  *H01L 23/28* (2006.01)
  *H01L 23/433* (2006.01)
  *H01L 25/18* (2006.01)
  *H01L 23/373* (2006.01)
  *H01L 25/07* (2006.01)
  *H01L 23/00* (2006.01)

(52) U.S. Cl.
  CPC ...... *H01L 23/3735* (2013.01); *H01L 23/4334* (2013.01); *H01L 23/49524* (2013.01); *H01L 23/49562* (2013.01); *H01L 23/49575* (2013.01); *H01L 24/45* (2013.01); *H01L 25/07* (2013.01); *H01L 25/18* (2013.01); *H01L 23/562* (2013.01); *H01L 2224/33* (2013.01); *H01L 2224/40225* (2013.01); *H01L 2224/4809* (2013.01); *H01L 2224/48091* (2013.01); *H01L 2224/48247* (2013.01); *H01L 2224/48472* (2013.01); *H01L 2224/49175* (2013.01); *H01L 2224/73265* (2013.01); *H01L 2924/00014* (2013.01); *H01L 2924/13055* (2013.01); *H01L 2924/13091* (2013.01); *H01L 2924/181* (2013.01)

(56) References Cited

FOREIGN PATENT DOCUMENTS

| JP | 2012-222159 A | 11/2012 |
| JP | 2015-211178 A | 11/2015 |
| WO | WO-2007/080785 A1 | 7/2007 |
| WO | WO-2012/096066 A1 | 7/2012 |

OTHER PUBLICATIONS

Office Action issued in corresponding Japanese Application No. 2017-560064 dated Jun. 11, 2019 with English machine translation.
Office Action received in corresponding Japanese Patent Application No. 2017-560064 dated Dec. 10, 2019 with English translation.

\* cited by examiner

POWER SEMICONDUCTOR DEVICE INCLUDING A SPACER

TECHNICAL FIELD

The present invention relates to a power semiconductor device.

BACKGROUND ART

A power semiconductor device performs a power converting function of converting DC power to AC power or AC power to DC power. The power semiconductor device includes a power semiconductor element configured to perform a switching operation.

As such a power semiconductor device, PTL 1 describes a power semiconductor device in which heat is dissipated from heat dissipation surfaces of respective substrates bonded to both surfaces of a power semiconductor element to a cooler. A power semiconductor device mounted on an electric vehicle such as a hybrid car, an electric car, and a fuel-cell car is required to be reduced in size and weight, and components inside the power semiconductor device are densely integrated. The power semiconductor device described in PTL 1 is excellent in heat dissipation. However, when the power semiconductor device is sealed with an insulating resin, input/output terminals are clamped by upper and lower dies, and the resin is filled in a space between the dies.

CITATION LIST

Patent Literature

PTL 1: JP 2003-31765 A

SUMMARY OF INVENTION

Technical Problem

Since the plurality of input/output terminals of the power semiconductor device described in PTL 1 are bonded to substrates corresponding to the respective input/output terminals, relative positions of the respective input/output terminals tend to vary. For this reason, at the time of clamping, excessive stress is applied to the bonding parts between the substrates and the input/output terminals, which may cause the bonding parts to be detached and cause the substrates to be cracked.

Solution to Problem

According to a first aspect of the present invention, a power semiconductor device includes: a semiconductor element including an upper electrode and a lower electrode; a first interconnection layer arranged to be opposed to the lower electrode of the semiconductor element and connected to the lower electrode of the semiconductor element via a bonding material; a second interconnection layer arranged to be opposed to the upper electrode of the semiconductor element and connected to the upper electrode of the semiconductor element via the bonding material; a first main terminal connected to the first interconnection layer via the bonding material; a second main terminal connected to the second interconnection layer via the bonding material; and a spacer, wherein the spacer is arranged to be parallel to the first interconnection layer or the second interconnection layer and is provided with the first main terminal or the second main terminal.

Advantageous Effects of Invention

According to the present invention, breakage of a power semiconductor device in a production process can be prevented.

BRIEF DESCRIPTION OF DRAWINGS

FIG. 1(A) is an upper view, FIG. 1(B) is a cross-sectional view along the line X-X, and FIG. 1(C) is a cross-sectional view along the line Y-Y.

FIG. 13 illustrates the power semiconductor device according to the fourth embodiment.

DESCRIPTION OF EMBODIMENTS

First Embodiment

Figure 1A:
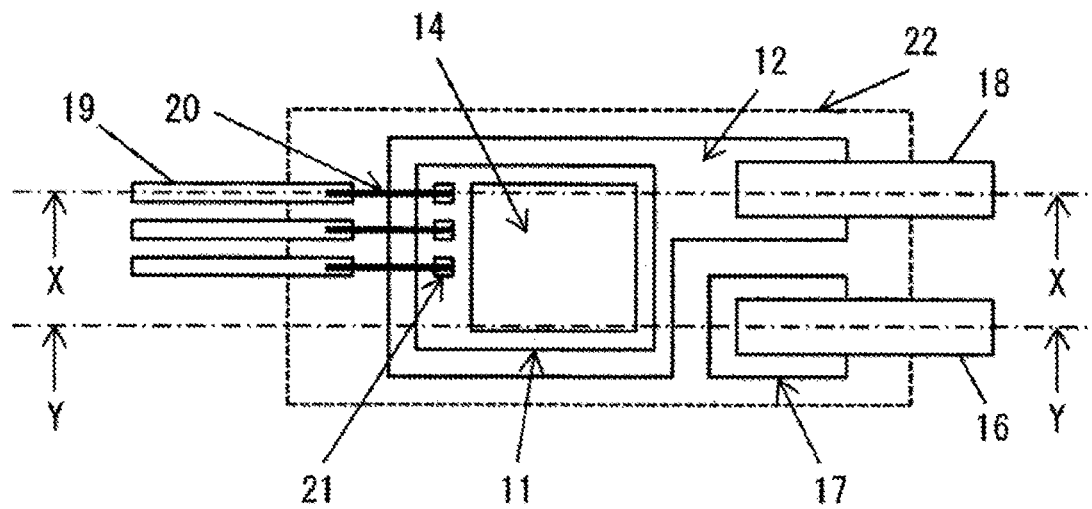
FIGS. 1(A) to 1(C) illustrate a power semiconductor device according to a first embodiment.
Figure 1B:
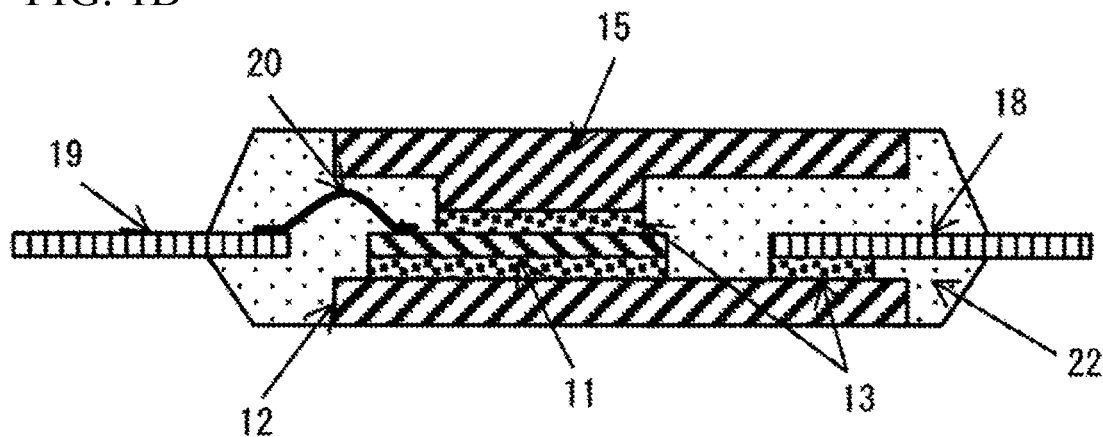
Figure 1C:
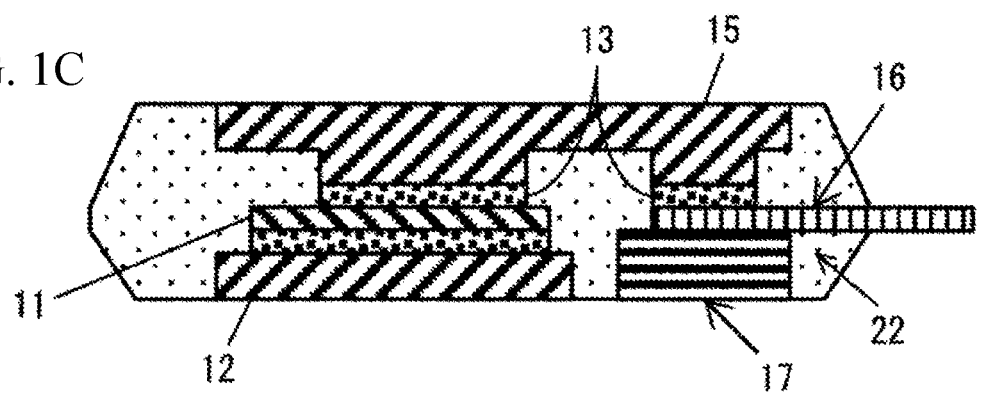

FIG. 1 illustrates a power semiconductor device according to the present embodiment, and FIG. 1(A) is an upper view thereof excluding a second interconnection layer 15 on an upper surface and a sealing resin 22 to facilitate understanding. FIG. 1(B) is a cross-sectional view along the line X-X in the upper view, and FIG. 1(C) is a cross-sectional view along the line Y-Y in the upper view. It is to be noted that, in these figures and the following respective figures, dimensions of components are illustrated to be exaggerated to facilitate understanding and are different from actual scaled-down dimensions.

As illustrated in FIG. 1(A) to 1(C), a lower electrode of a power semiconductor element 11 is connected via a bonding material 13 to a first interconnection layer 12 arranged on the lower side of the power semiconductor element 11 to be opposed to the lower electrode, and an upper electrode 14 of the power semiconductor element 11 is connected via the bonding material 13 to the second interconnection layer 15 arranged on the upper side of the power semiconductor element 11 to be opposed to the upper electrode 14. Also, a second main terminal 16 electrically connected to the upper electrode 14 of the power semiconductor element 11 is connected via the bonding material 13 to the second interconnection layer 15 and is mounted and positioned on a spacer 17 arranged to be parallel to the first interconnection layer 12 on the lower surface of the device. A first main terminal 18 electrically connected to the lower electrode of the power semiconductor element 11 is connected via the bonding material 13 to the first interconnection layer 12. Each of control terminals 19 is connected via a wire interconnection line 20 to a control electrode 21 of the power semiconductor element 11. The sealing resin 22 seals the respective components including the power semiconductor element 11.

For each of the interconnection lines and main terminals, a metal, a metal-and-inorganic substance composite material, or a metal-and-organic substance composite material can be selected, and a metal consisting primarily of Cu, Ni, Al, or the like is preferable since the metal is high in electric conductivity and heat conductivity and is relatively easily available. The thickness of each of the main terminals can be set in a range from 0.5 mm to 2 mm. The thickness of each of the interconnection lines can be set in a range from 0.1 mm to 3 mm.

Next, a procedure for manufacturing the power semiconductor device according to the present embodiment will be described.

[Process A: Preparation for First Interconnection Layer and Spacer]

First, the first interconnection layer 12 and the spacer 17 are arranged in parallel at predetermined positions.

At this time, the first interconnection layer 12 and the spacer 17 are positioned with use of not-illustrated positioning means such as a jig, an adhesive sheet, and a decompression adsorption table.

[Process B: Connection of First Main Terminal and Positioning of Second Main Terminal]

Subsequently, the bonding material 13 and the first main terminal 18 are arranged at a predetermined position on the first interconnection layer 12 corresponding to the first main terminal 18, and the second main terminal 16 is mounted at a predetermined position on the spacer 17 and is connected by means of the bonding material 13.

As the bonding material 13, a known material such as conductive paste containing particles of a metal, carbon, or the like, solder, a brazing material, and a sintering material can be used, and a connecting method suitable for the material is employed. Alternatively, a direct bonding method without using the bonding material 13 such as laser welding, ultrasonic welding, and plasma activation low-temperature bonding may be selected. In the direct bonding method, an influence of dimension tolerance of the bonding material 13 can be eliminated, and the process can be simplified. In a case in which any direct bonding method is employed, "bonding material" in the respective figures and description thereof according to the present and other embodiments is substituted with "bonding layer."

Also, the spacer 17 functions as a positioner for the second main terminal 16. Accordingly, in a case in which the second main terminal 16 is connected to the spacer 17 via the same or different bonding material 13 as or from the above bonding material, displacement can be prevented in the subsequent processes. In a case in which the same bonding material 13 is used, the second main terminal 16 can be connected in the same process as that for connection of the first main terminal 18, which can contribute to reduction in the number of processes.

Figure 2A:
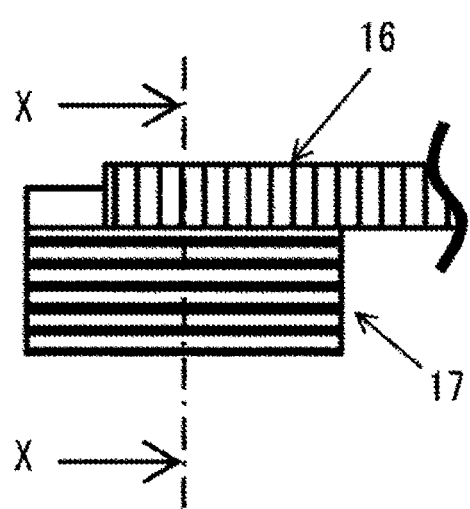
FIG. 2(A) is a partially enlarged view of the power semiconductor device according to the first embodiment.
Figure 2B:
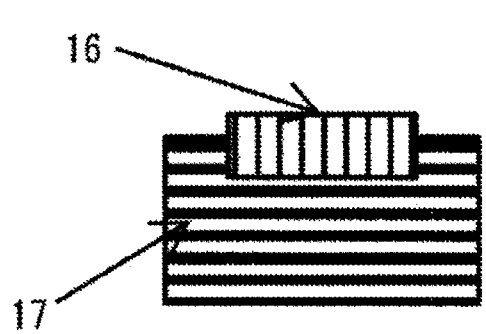
FIG. 2(B) is a cross-sectional view along the line X-X.

FIG. 2(A) is a partially enlarged view illustrating the second main terminal 16 and the spacer 17 in FIG. 1(C), and FIG. 2(B) is a cross-sectional view along the line X-X in FIG. 2(A). As illustrated in FIG. 2, a part or an entirety of side surfaces of the second main terminal 16 (illustration omitted) is inserted or fitted and secured into a recess formed in the spacer 17 to simplify positioning means. Also, insertion or fitting and a bonding material or direct metal bonding may be combined. As a material for the spacer 17, an insulating or conductive material such as a metal, a resin, ceramic, glass, and a composite material thereof can be selected. In a case in which the spacer 17 is connected to the second main terminal 16 via the bonding material 13, a material for the spacer 17 is selected to be suitable for the bonding material 13. For example, in a case in which a metal such as Cu and Ni is selected as a material for the spacer 17, solder can be selected as the bonding material 13.

Also, in a similar manner to Process A, the first main terminal 18 and the second main terminal 16 can be positioned with use of positioning means, and the positioning means can be combined with the positioning means in Process A. For example, a decompression adsorption table is used in Process A, and a jig is used in the present process. In a case in which a jig is used both in Process A and the present process, using an integrated jig enables positioning accuracy of the respective components to be further improved.

Figure 3A:
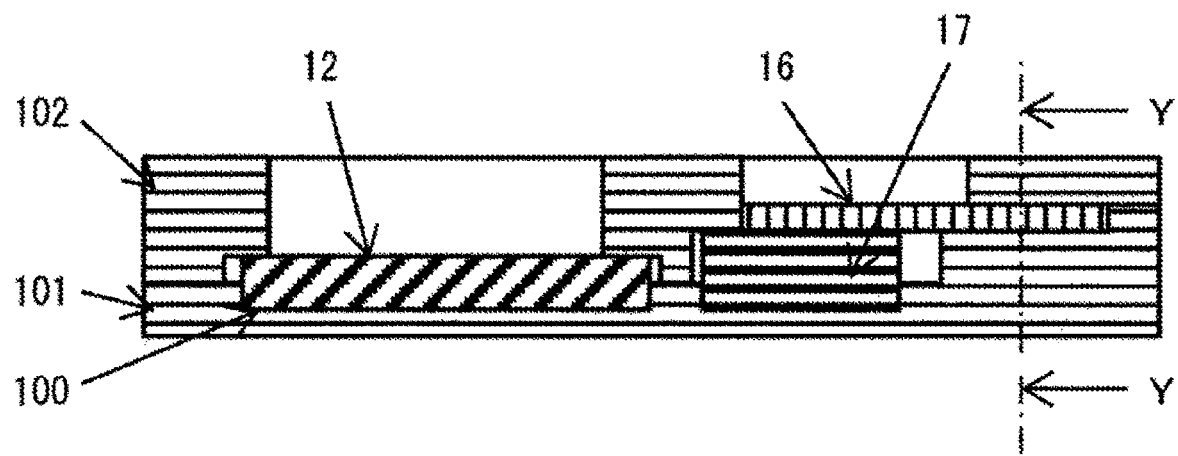
FIGS. 3(A) and 3(B) illustrate positioning of members in the first embodiment.
Figure 3B:
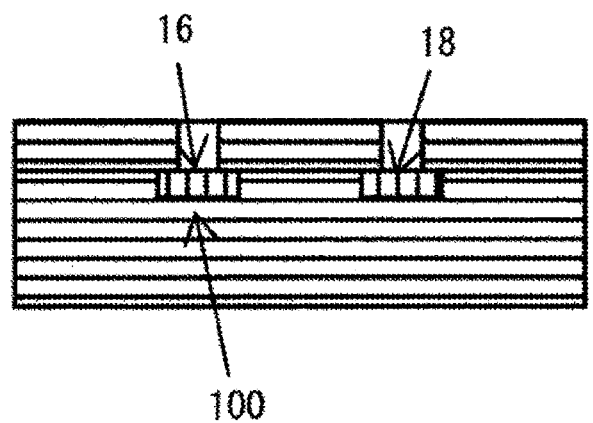

FIGS. 3(A) and 3(B) illustrate positioning of the members in the first embodiment. FIG. 3(B) is a cross-sectional view along the line Y-Y in FIG. 3(A). As illustrated in FIGS. 3(A) and 3(B), the members such as the first interconnection 12, the spacer 17, the first main terminal 18, and the second main terminal 16 are positioned with use of a recess 100 of a lower jig 101. Further, by interposing the respective members by an upper jig 102, the respective members can be positioned in an up-down direction.

Figure 4A:
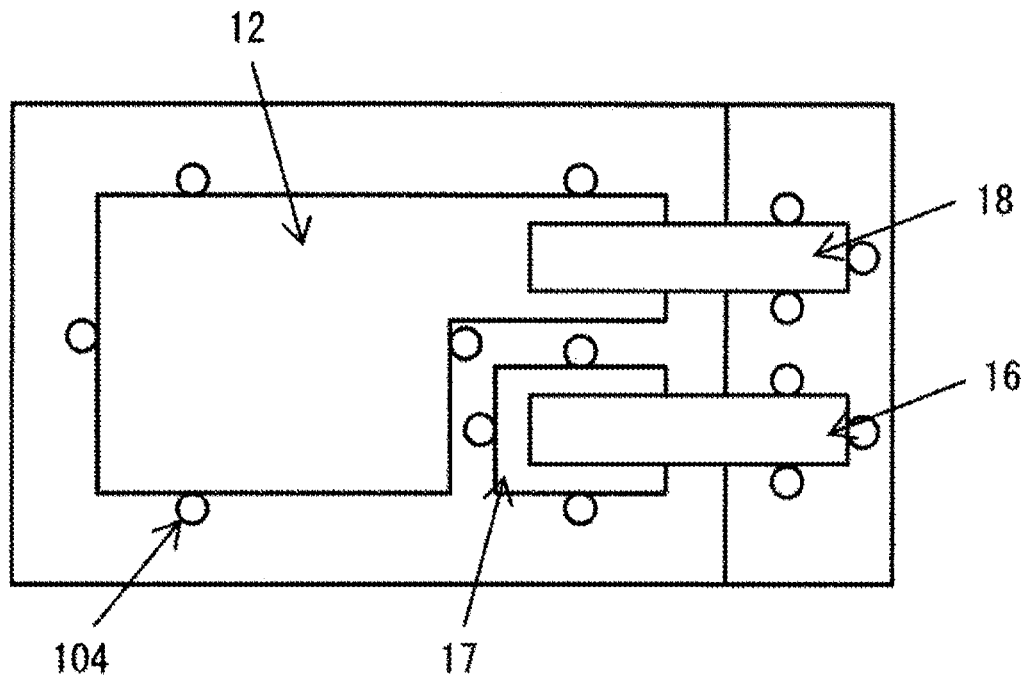
FIGS. 4(A) and 4(B) illustrate positioning in the first embodiment with use of guide pins.
Figure 4B:
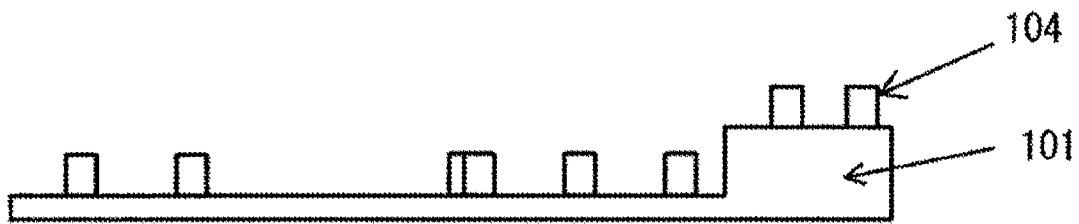

FIGS. 4(A) and 4(B) illustrate positioning of the members in the first embodiment with use of guide pins. FIG. 4(A) is an upper view, and FIG. 4(B) is a side view of guide pins and the jig. As illustrated in FIGS. 4(A) and 4(B), the first interconnection layer 12, the first main terminal 18, and the second main terminal 16 are positioned with use of guide pins 104. Meanwhile, the first main terminal 18 and the second main terminal 16 may be separated from a lead frame. That is, by using a lead frame into which the first main terminal 18 and the second main terminal 16 are integrated via a not-illustrated tie bar, positioning means can be simplified. The tie bar can be cut in any of the subsequent processes.

As described above, since the first main terminal 18 and the second main terminal 16 are positioned, relative positional accuracy between the first main terminal 18 and the second main terminal 16 is improved, excessive stress to the bonding material 13 due to clamping of a die in a sealing process by means of a below-mentioned transfer molding method is not generated, and breakage of the power semiconductor device can be prevented.

[Process C: Connection of Power Semiconductor Element]

Subsequently, the bonding material 13 and the power semiconductor element 11 are arranged at a predetermined position on the first interconnection layer 12 corresponding to the power semiconductor element 11 to connect the power semiconductor element 11 by means of the bonding material 13.

As a material for the bonding material 13, a similar material to that in Process B can be selected. Meanwhile, the power semiconductor element 11 can be positioned with use of a jig. Ina case in which a liquid material such as solder paste and conductive paste is selected as the bonding material 13, the power semiconductor element 11 can be positioned with use of viscosity of the bonding material 13. In a case in which the same bonding material 13 as that in Process B is used, the present process and Process B can be performed at the same time, which can contribute to reduction in the number of processes.

[Process D: Connection of Control Terminal]

Subsequently, each of the control terminals 19 is arranged at a predetermined position, and the control electrode 21 of the power semiconductor element 11 and the control terminal 19 are connected by means of a wire bonding method using the wire interconnection line 20.

In a similar manner to Process A, the control terminal 19 can be positioned with use of positioning means, and the positioning means can be combined with the positioning means in Process A and/or Process B.

It is to be noted that, although three control electrodes 21 are illustrated in the present embodiment, the number of control electrodes 21 is not limited to this. For example, detection electrodes such as a temperature sensor and a current sensor integrated into or arranged close to the power semiconductor element 11 can arbitrarily be added. Also, the control terminals 19 and the first main terminal 18 and/or the second main terminal 16 may be separated from a lead frame. That is, by using a lead frame into which they are integrated via a not-illustrated tie bar, positioning means for the control terminals 19 can be simplified.

[Process E: Connection of Second Interconnection Layer]

Subsequently, the bonding material 13 and the second interconnection layer 15 are arranged at predetermined positions on the upper surfaces of the power semiconductor element 11 and the second main terminal 16 to connect the power semiconductor element 11 and the second main terminal 16 by means of the bonding material 13. As a material for the bonding material 13, a similar material to those in Process B and Process C can be selected. That is, in a case in which the same bonding material 13 as those in Process B and Process C is used, the present process, Process B, and Process C can be performed at the same time, which can contribute to reduction in the number of processes. In this case, Process D can be performed after the present process.

It is to be noted that the order of Process A to Process E may arbitrarily be changed, and Process A to Process E may be performed at the same time. The order is not limited to one in the present embodiment.

[Process F: Resin Sealing]

Subsequently, the power semiconductor element 11, the first interconnection layer 12, the second interconnection layer 15, the spacer 17, the second main terminal 16, the first main terminal 18, and the control terminals 19 are clamped in a state of being arranged at predetermined positions in a cavity formed by the upper die and the lower die and are sealed by the sealing resin in the transfer molding method.

In a case in which the spacer 17 is not secured to the second main terminal 16 or is not connected to the second main terminal 16 via the bonding material 13, the spacer 17 is provided with an adhesive sheet between the spacer 17 and one of the upper and lower dies on which the spacer 17 is to abut, or the spacer 17 is sucked by providing the die with a suction mechanism, to position the spacer 17 with respect to the die.

The surface, opposite the power semiconductor element 11, of at least one of the first interconnection layer 12, the second interconnection layer 15, and the spacer 17 is partially or entirely exposed from the sealing resin, is brought into close contact with a cooling member such as a cooler and a heatsink, and is cooled. An insulating material such as ceramic and an insulating resin sheet is interposed between the exposed surface and the cooling member as needed.

Figure 5:
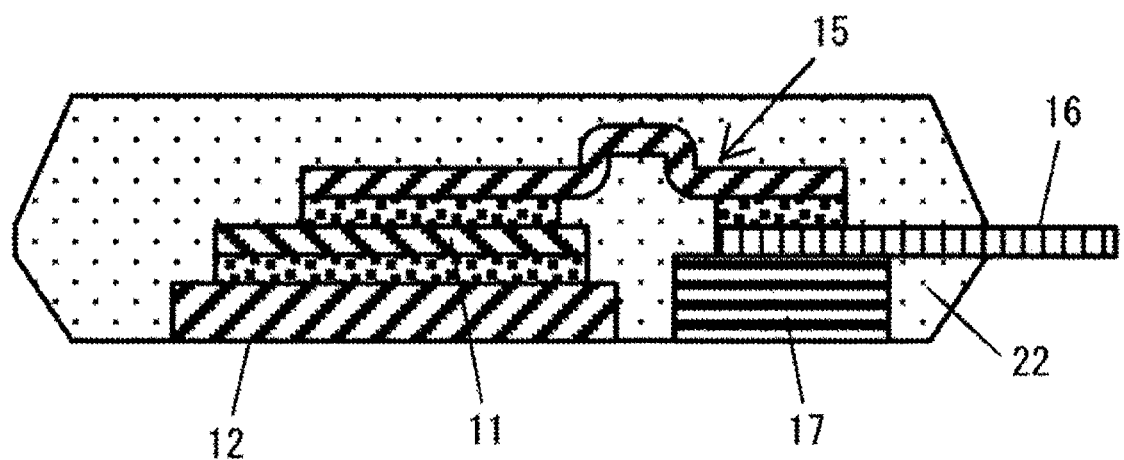
FIG. 5 illustrates Modification Example 1 of the first embodiment.

FIG. 5 illustrates Modification Example 1 of the first embodiment and is a cross-sectional view corresponding to FIG. 1(C). For example, in a case of the power semiconductor element 11 with a smaller amount of heat generation or the power semiconductor device less requiring cooling performance, the second interconnection layer 15 can be sealed into the sealing resin 22 while the first interconnection layer 12 can be exposed from the sealing resin 22 as illustrated in FIG. 5. In this case, since a relatively thin material can be used for the second interconnection layer 15, the second interconnection layer 15 can be formed by means of reasonable press work.

On the other hand, in a case in which the first interconnection layer 12 and the second interconnection layer 15 are exposed, the power semiconductor device can be cooled from both sides and can thus achieve high cooling performance, which is advantageous in size reduction and high density of a power conversion device using the power semiconductor device. Also, in a case in which the spacer 17 is exposed and cooled as well, heat caused by self-heating of the second main terminal 16 and heat caused by heat generation of interconnection lines and electric parts connected to the second main terminal 16 can be cooled via the spacer 17. Thus, higher cooling performance can be achieved. That is, in a case in which the spacer 17 is made of a metal excellent in heat conductivity such as Cu and Al, highly heat-conductive ceramic such as alumina, silicon nitride, and boron nitride, or a highly heat-conductive resin obtained by highly filling an insulating resin such as epoxy and polyamide with a heat-conductive filler or a heat-conductive fiber, high cooling performance can be achieved.

Figure 6A:
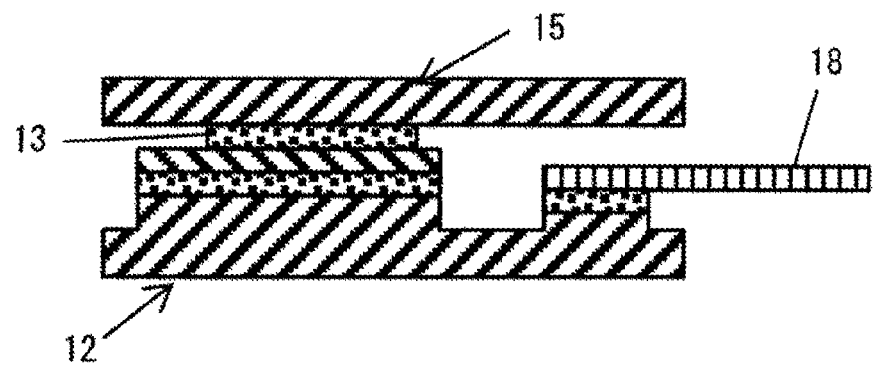
FIGS. 6(A) to 6(C) illustrate examples of an interconnection layer of the first embodiment.
Figure 6B:
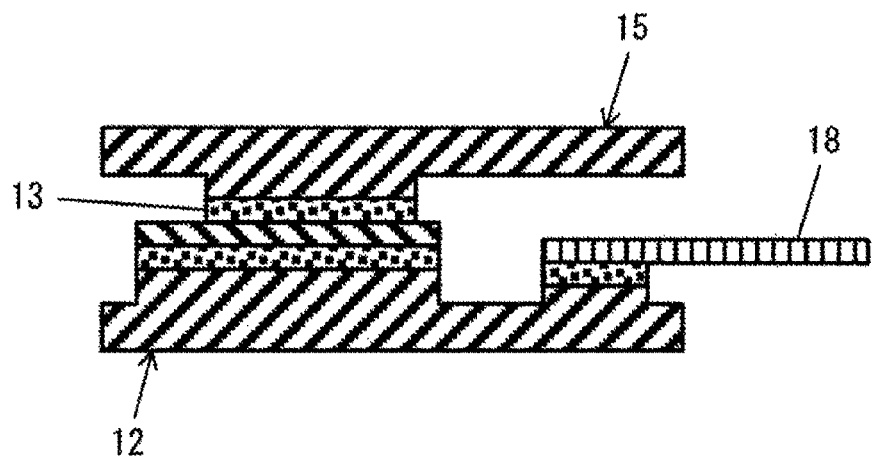
Figure 6C:
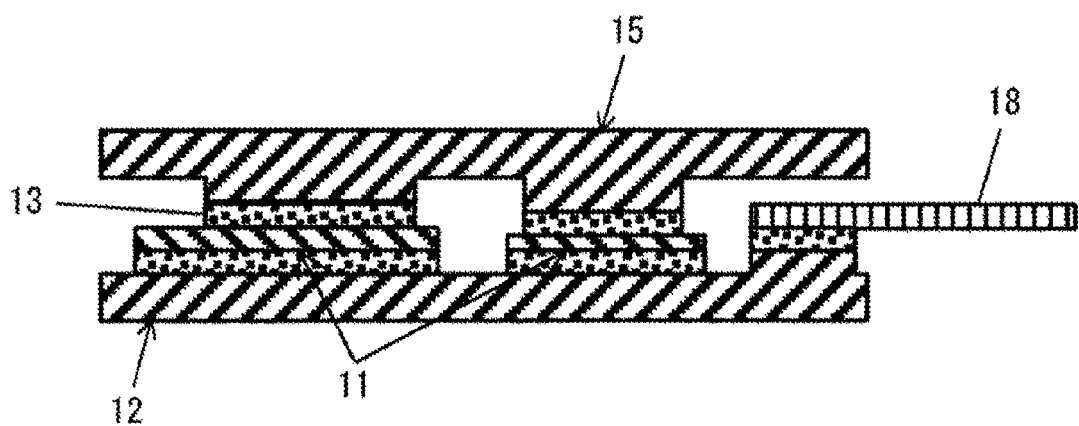

Meanwhile, as for the second interconnection layer 15 according to the present embodiment, an opposed region to the bonding material 13 is formed to be protruded further than a circumference thereof, and the present invention is not limited to this. FIGS. 6(A) to 6(C) illustrate examples of the interconnection layer. For example, the opposed region of the second interconnection layer 15 to the bonding material 13 and the circumference may be on an equal plane. As illustrated in FIG. 6(A), the opposed region of the first interconnection layer 12 to the bonding material 13 may be protruded. Also, as illustrated in FIG. 6(B), the opposed regions of the first interconnection layer 12 and the second interconnection layer 15 to the bonding materials 13 may be protruded.

Also, as in a below-mentioned fourth example (FIG. 13(C)), the heights of the first interconnection layer 12 and the second interconnection layer 15 may be changed. In this case, as illustrated in FIG. 6(C), by adjusting the protruding thicknesses (heights), the first interconnection layer 12 and the second interconnection layer 15 can correspond to the different thicknesses of the power semiconductor element 11, the bonding material 13, the second main terminal 16, and the first main terminal 18. In particular, in a case in which a plurality of different power semiconductor elements 11 are arranged in parallel and/or in series with respect to the first interconnection layer 12 and the second interconnection layer 15, it is difficult to make the thicknesses of the respective power semiconductor elements 11 equal, and the thicknesses of the respective power semiconductor elements 11 are individually set in a range from 0.05 mm to 0.2 mm. Changing the heights of the first interconnection layer 12 and the second interconnection layer 15 is suitable for absorbing the thickness difference. Also, insulation distances in the thickness direction between the first interconnection layer 12 and the second interconnection layer 15 and between the first interconnection layer 12 and the second interconnection layer 15, and the second main terminal 16 and the first main terminal 18, can be secured.

Figure 7:
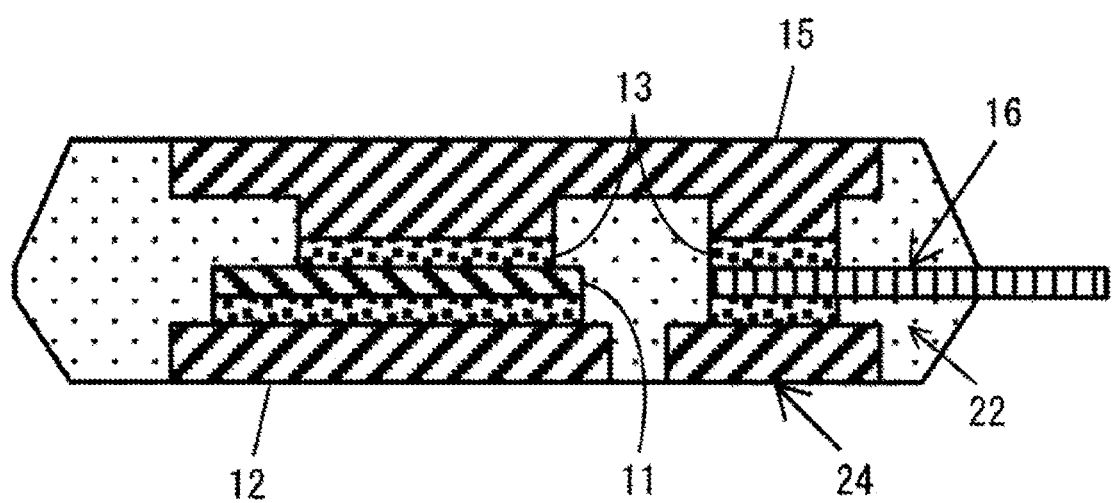
FIG. 7 illustrates Modification Example 2 of the first embodiment.

FIG. 7 illustrates Modification Example 2 of the first embodiment and is a cross-sectional view corresponding to FIG. 1(C). The modification example 2 differs from the first embodiment in that a third interconnection layer 24 is used instead of the spacer 17 and is connected to the second main terminal 16 via the bonding material 13. The other configuration is similar to that of the first embodiment, and description thereof is thus omitted.

In FIG. 7, the third interconnection layer 24 is arranged in parallel with the first interconnection layer 12 to be spaced from the first interconnection layer 12 to electrically insulate the third interconnection layer 24 from the first interconnection layer 12. The third interconnection layer 24 is connected to the second main terminal 16 to electrically connect the third interconnection layer 24 to the electrode of the power semiconductor element 11. Meanwhile, the first interconnection layer 12 and the third interconnection layer 24 are preferably separated from a lead frame. That is, by using a lead frame into which the first interconnection layer 12 and the third interconnection layer 24 are integrated via a not-illustrated tie bar, positioning means can be simplified, and the number of processes can drastically be reduced. The tie bar may be cut in any of the processes after the first interconnection layer 12 is connected to the power semiconductor element 11, and after the third interconnection layer 24 is connected to the second main terminal 16.

Second Embodiment

Figure 8A:
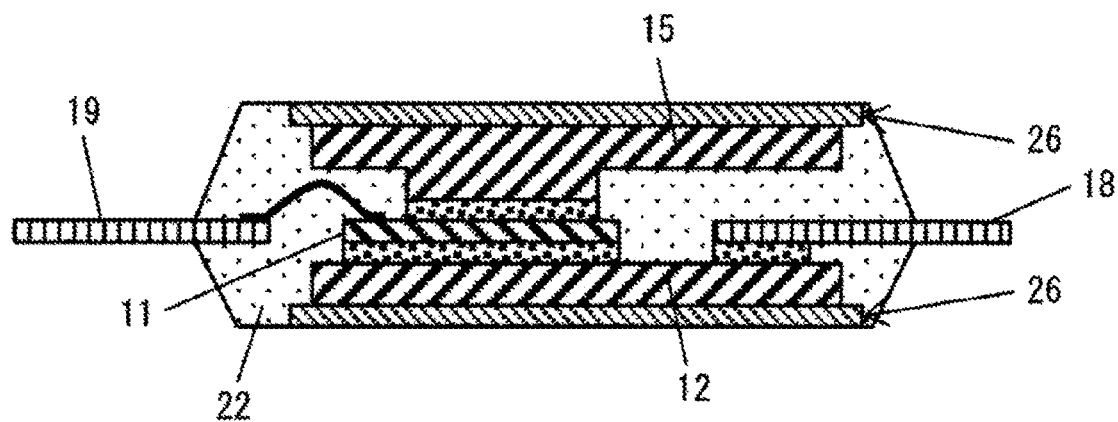
FIGS. 8(A) and 8(B) illustrate a power semiconductor device according to a second embodiment.
Figure 8B:
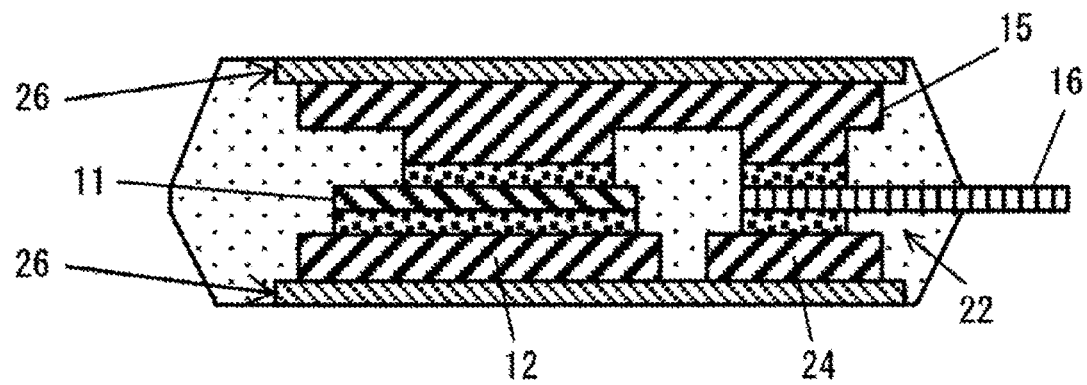

FIGS. 8(A) and 8(B) illustrate a second embodiment of the power semiconductor device according to the present invention. FIG. 8(A) is a cross-sectional view corresponding to FIG. 1(B) of the first embodiment, and FIG. 8(B) is a cross-sectional view corresponding to FIG. 7 of the first embodiment. The present embodiment differs from the first embodiment in that an insulating layer 26 is laminated on a surface, opposite the bonding material 13, of each of the first interconnection layer 12 to the third interconnection layer 24. The other configuration is similar to that of the first embodiment, and description thereof is thus omitted.

The present embodiment exerts the following effects in addition to the effects of the first embodiment.

As a first effect, since the insulating layer 26 laminated on each of the interconnection layers is exposed from the sealing resin 22, no insulating material is required to be interposed between the exposed surface and the cooling member as in the first embodiment.

Also, as a second effect, since an interconnection board in which a laminated plate formed by laminating and attaching a metal plate such as Cu and Al and an insulating layer is etched, and in which the metal plate is processed to form respective interconnection lines, or an interconnection board in which an insulating layer is laminated and attached to a metal plate provided with respective interconnection lines by means of press work, can be used, a tie bar integrating the first interconnection layer 12 and the third interconnection layer 24 is not required to be cut as in the first embodiment.

As the insulating layer 26, highly heat-conductive ceramic such as alumina, silicon nitride, and boron nitride, or a highly heat-conductive resin obtained by highly filling an insulating resin such as epoxy and polyamide with a heat-conductive filler such as alumina, silicon nitride, and boron nitride, can be used.

The highly heat-conductive ceramic or the highly heat-conductive resin may be laminated anytime during the process of connecting respective interconnection lines in the first embodiment (that is, the process corresponds to Process E in the first embodiment) to the process of resin sealing (the process corresponds to Process F in the first embodiment).

Figure 9:
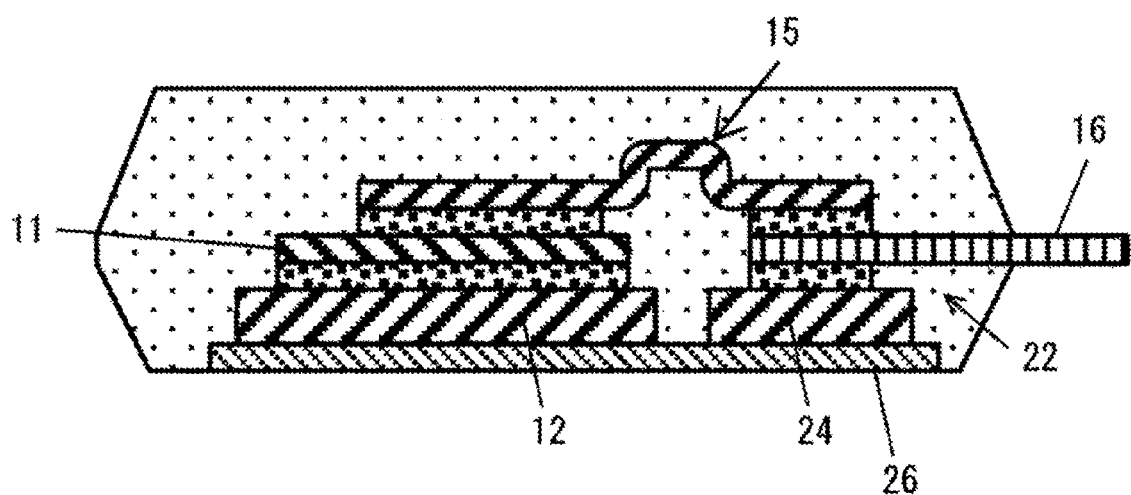
FIG. 9 illustrates Modification Example of the second embodiment.

FIG. 9 illustrates Modification Example of the second embodiment. As illustrated in FIG. 9, in a similar manner to the first embodiment, in a case of the power semiconductor device relatively less requiring heat dissipation, the insulating layer 26 may be laminated on only one of the upper and lower surfaces.

Third Embodiment

Figure 10A:
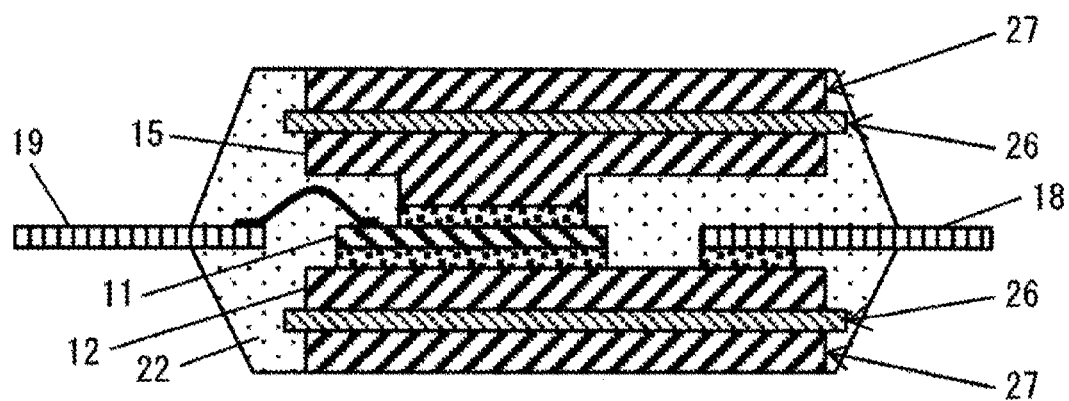
FIGS. 10(A) and 10(B) illustrate a power semiconductor device according to a third embodiment.
Figure 10B:
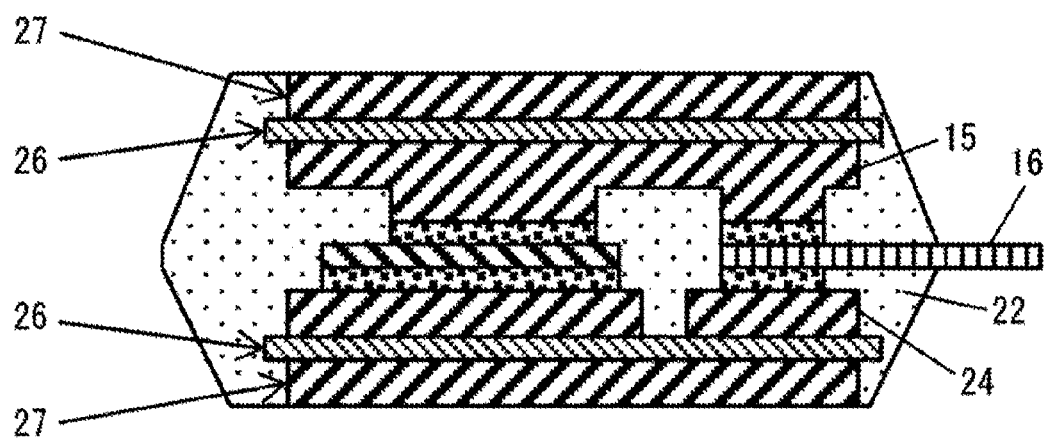

FIGS. 10(A) and 10(B) illustrate a power semiconductor device according to a third embodiment. FIG. 10(A) is a cross-sectional view corresponding to FIG. 8(A) of the second embodiment, and FIG. 10(B) is a cross-sectional view corresponding to FIG. 8(B) of the second embodiment. The present embodiment differs from the second embodiment in that a heat dissipating layer 27 is laminated on the insulating layer 26. The other configuration is similar to that of the second embodiment, and description thereof is thus omitted.

As a material for the heat dissipating layer 27, a metal such as Cu and Al can be used. Since a cooler and a heatsink can be connected to an exposed surface of the heat dissipating layer 27, heat resistance can be decreased, and high cooling performance can be obtained. Also, since the heat dissipating layer 27 in the present embodiment does not need to be conductive, a semiconductor or a composite material such as SiC and AlSiC can be used, and the heat dissipating layer 27 may be plated as needed.

Further, an insulating substrate obtained by laminating and attaching the interconnection layer, the insulating layer 26, and the heat dissipating layer 27 in advance can be used. The insulating substrate can be prepared by brazing or directly attaching the interconnection layer and the heat dissipating layer to a ceramic plate or by forming the interconnection layer and the heat dissipating layer on the ceramic plate by means of a molten metal treatment method.

Figure 11A:
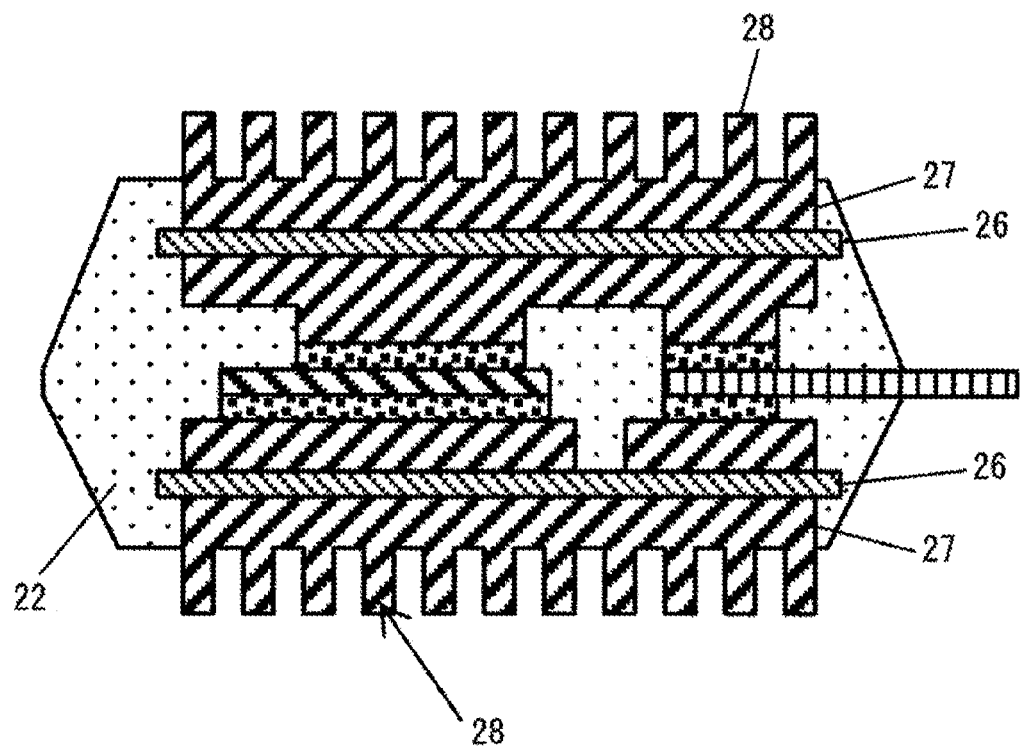
FIGS. 11(A) and 11(B) illustrate Modification Example of the third embodiment.
Figure 11B:
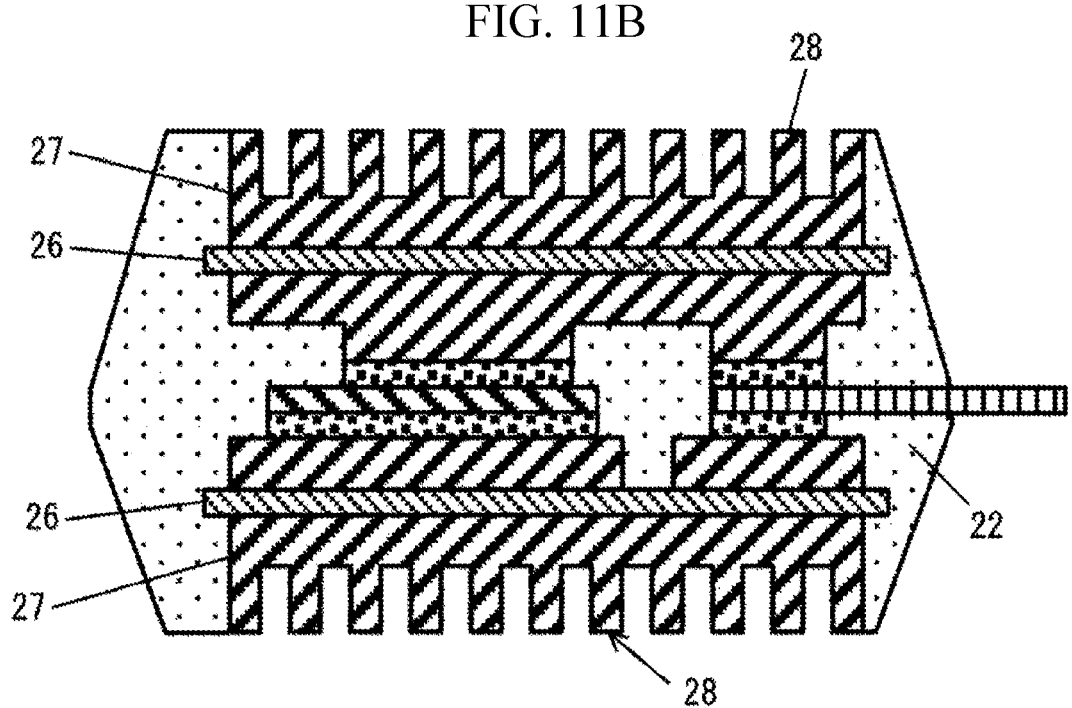

FIGS. 11(A) and 11(B) illustrate Modification Example of the third embodiment. FIG. 11(A) illustrates an example in which a fin 28 is protruded from the sealing resin 22 while FIG. 11(B) illustrates an example in which the fin 28 is housed in the sealing resin 22. As illustrated in FIGS. 11(A) and 11(B), the plate-like or pin-like (columnar) fin 28 is formed integrally with the heat dissipating layer 27 and is exposed from the sealing resin 22 to enable high cooling performance to be obtained. As a method for forming the fin 28 integrally with the heat dissipating layer 27, the fin 28 is brazed or directly attached to the heat dissipating layer 27, or the heat dissipating layer 27 integrated with the fin 28 by means of extrusion molding or forging is brazed or directly attached to a ceramic plate. In a case in which the insulating substrate is prepared by means of the molten metal treatment method, the fin 28 can be formed integrally with the heat dissipating layer 27 easily by forming the fin 28 in a mold. In this case, since there is no connection interface between the heat dissipating layer 27 and the fin 28, heat resistance of the power semiconductor device can further be improved. It is to be noted that, although the fins are provided on the heat dissipating layers on both sides in FIGS. 11(A) and 11(B), the fin may be provided only on either the upper side or the lower side.

The present embodiment exerts the following effects in comparison with the second embodiment.

That is, in the interconnection layers in the second embodiment, warping is generated by a difference in heat expansion coefficient between the interconnection layer 12 or 15 and the insulating layer 26. Thus, to decrease the difference in heat expansion coefficient between the interconnection layer and the insulating layer 26, materials needs to be restricted, and the structure needs to be considered. For example, in a case in which the interconnection layer is made of a metal such as Cu and Al, a highly heat-conductive resin needs to be highly filled with a low-heat-expansion inorganic filler. In a case in which the insulating layer 26 is made of ceramic, a metal such as Mo and W and a low-heat-expansion alloy such as 42 alloy and invar need to be used. Also, materials having relatively different heat expansion coefficients can be employed to decrease the influence of warping by means of process control. However, this may complex the processes.

According to the present embodiment, in a case in which the interconnection layer 12 or 15 and the heat dissipating layer 27 made of a metal or the like are laminated and attached to both surfaces of the insulating layer 26, the substrate can be symmetric across the insulating layer 26 in the thickness direction, and the material restriction and the process complexity can thus be reduced. Meanwhile, since the interconnection layer 12 or 15 and the heat dissipating layer 27 have different areas, warping can be restricted by appropriately adjusting the respective thicknesses.

In each of the above first to third embodiments, one power semiconductor element 11 is provided. However, the present invention is not limited to this, and a plurality of power semiconductor elements 11 of equal or different kind may be arranged in parallel or in series. That is, the power semiconductor elements 11 can arbitrarily be combined by using MOSFETs as the power semiconductor elements 11 and connecting the MOSFETs in parallel, by connecting a diode in anti-parallel with an IGBT or a bipolar transistor, or by connecting them in series to form a bridge configuration.

Fourth Embodiment

Next, a fourth embodiment will be described with reference to FIGS. 12 to 21. The fourth embodiment will be described, taking a bridge-configuration power semiconductor device exerting especially high effects as an example. It is to be noted that, although the present embodiment is based on the configuration of the third embodiment, the present invention is not limited to this, and the present embodiment can be carried out by combining the first to third embodiments.

Figure 12:
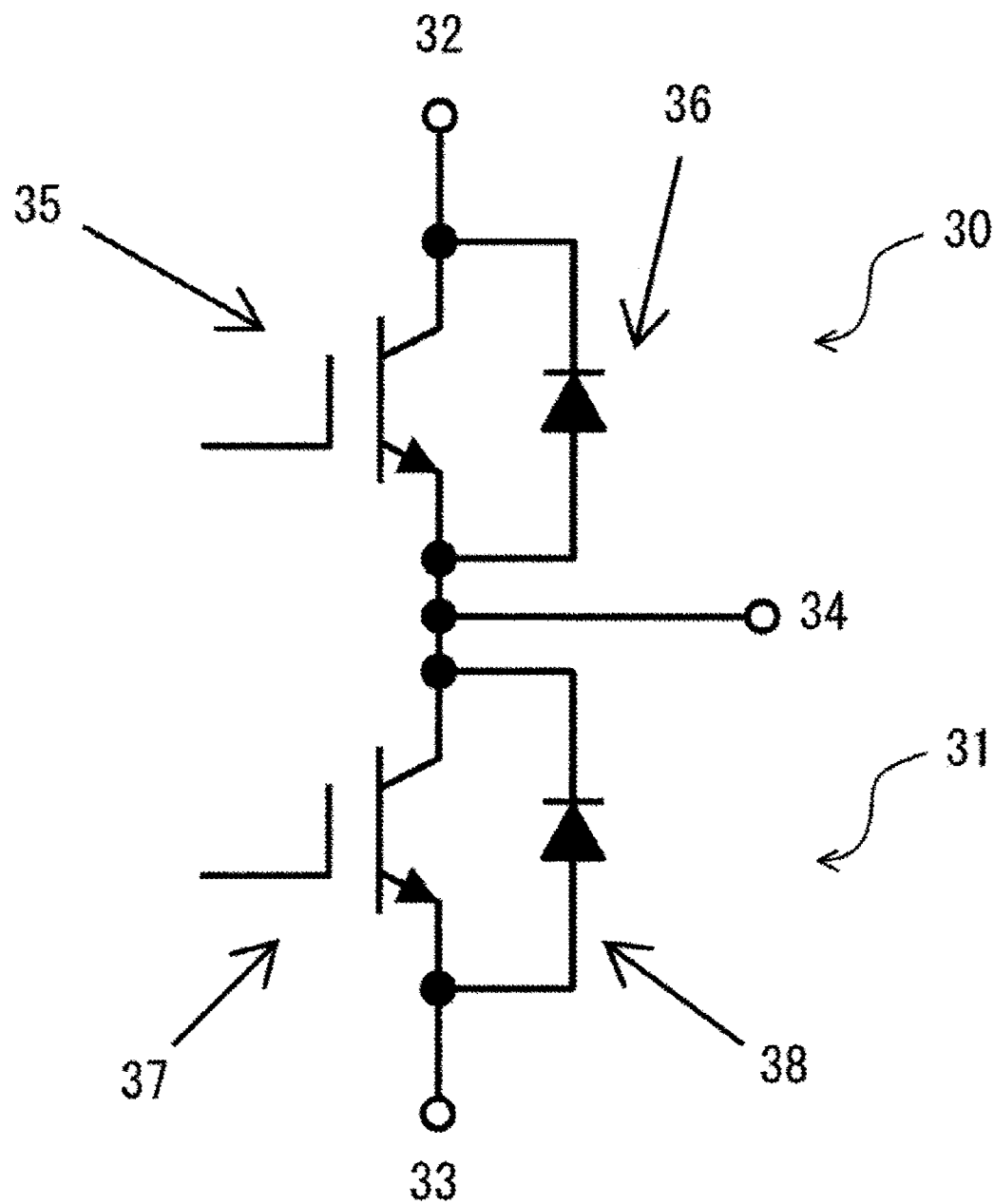
FIG. 12 is a circuit configuration diagram of a power semiconductor device according to a fourth embodiment.

FIG. 12 is a circuit configuration diagram of a bridge-configuration power semiconductor device. As illustrated in FIG. 12, power semiconductor elements constituting an upper arm 30 and a lower arm 31 are connected in series between a positive-electrode-side main terminal 32 and a negative-electrode-side main terminal 33, and a middle-side main terminal 34 is connected from a connection point of the upper and lower arms. In the present embodiment, as the power semiconductor elements, an upper arm IGBT 35 and an upper arm diode 36 are connected in parallel while a lower arm IGBT 37 and a lower arm diode 38 are connected in parallel. This bridge is provided, or a plurality of bridges is connected in parallel, for use as a power conversion device for DC-AC conversion, AC-DC conversion, DC voltage conversion, and the like.

Figure 13A:
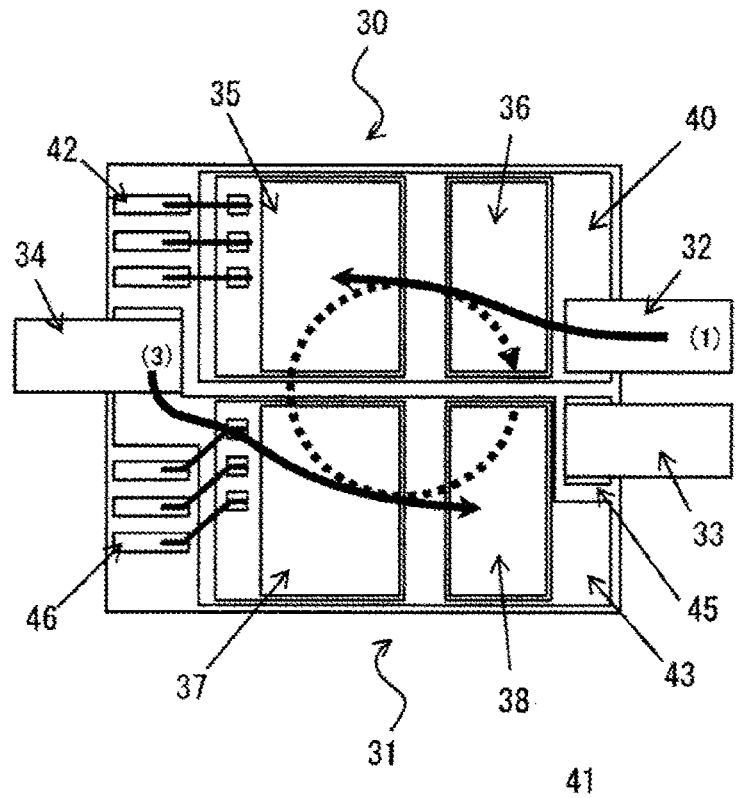
FIGS. 13(A) and 13(B) are upper views.
Figure 13B:
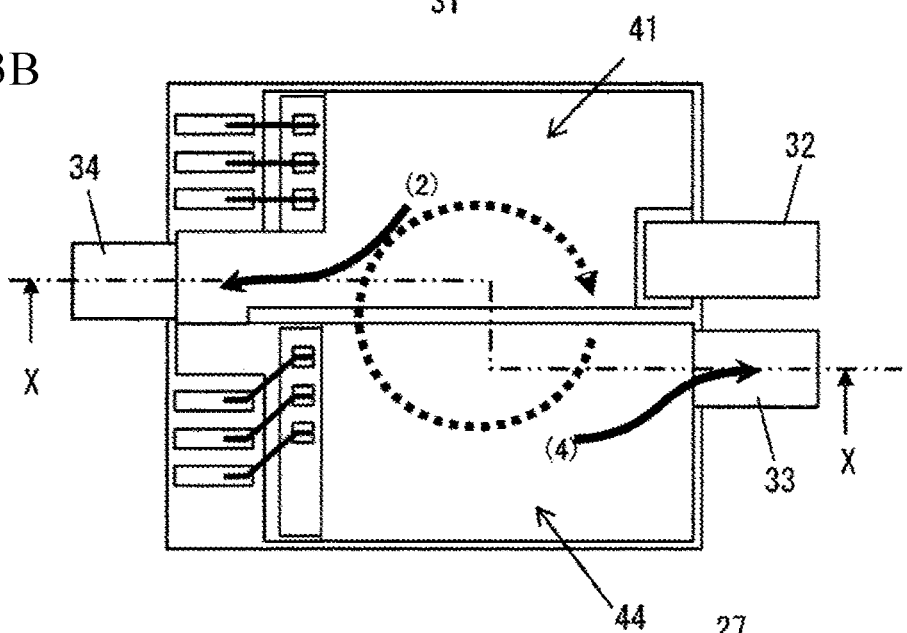
Figure 13C:
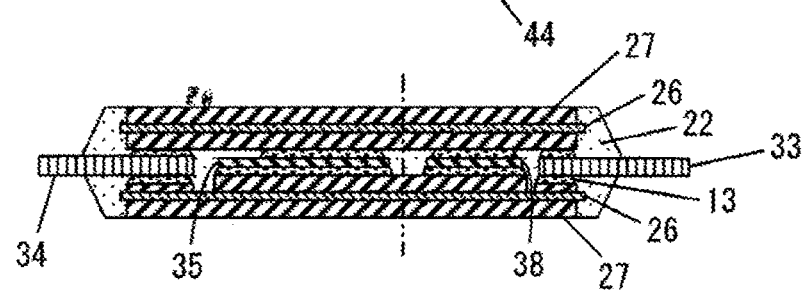
FIG. 13(C) is a cross-sectional view along the X-X line.

FIG. 13 illustrates an external view of the power semiconductor device. FIG. 13(A) is an upper view excluding the sealing resin 22, the upper insulating layer 26, and the upper bonding material, FIG. 13(B) is an upper view obtained by adding interconnection lines of the upper insulating layer 26 to FIG. 13(A), and FIG. 13(C) is a cross-sectional view along the X-X line in FIG. 13(B).

In the present embodiment, the upper arm IGBT 35 and the upper arm diode 36 are connected via the bonding material 13 to an upper-arm-side first interconnection line 40 of the lower insulating layer 26, and the lower arm IGBT 37 and the lower arm diode 38 are connected via the bonding material 13 to a lower-arm-side first interconnection line 43. Also, the positive-electrode-side main terminal 32 is connected via the bonding material 13 to the upper-arm-side first interconnection line 40, the negative-electrode-side main terminal 33 is connected via the bonding material 13 to a lower-arm-side third interconnection line 45, and the middle-side main terminal 34 is connected via the bonding material 13 to a lower-arm-side first interconnection line 43. Further, an upper-arm-side second interconnection line 41 of the upper insulating layer 26 is connected via the bonding material 13 to the upper arm IGBT 35, the upper arm diode 36, and the middle-side main terminal 34, and a lower-arm-side second interconnection line 44 is connected via the bonding material 13 to the lower arm IGBT 37, the lower arm diode 38, and the negative-electrode-side main terminal 33.

With such a configuration, the middle-side main terminal 34 can perform both current input/output and electric connection between the upper arm and the lower arm. Conventionally, since a metal block is used, and the upper-arm-side second interconnection line 41 and the lower-arm-side first interconnection line 43 are connected via bonding materials to the upper surface and the lower surface of the metal block, management of components in the process is complexed. In the present embodiment, such complexity is eliminated.

Meanwhile, suppose there is a state in which the lower arm diode 38 is in a conductive state in a forward bias state. In this state, when the upper arm IGBT 35 is turned on, the lower arm diode 38 is in a reverse bias state, and recovery current resulting from carrier transfer passes through the upper and lower arms. At this time, the recovery current flows in the solid arrows in FIG. 13. That is, loop current flows from the positive-electrode-side main terminal 32 to the upper-arm-side first interconnection line 40 (arrow (1)), from a collector electrode to an emitter electrode of the upper arm IGBT 35, from the upper-arm-side second interconnection line 41 to the middle-side main terminal 34 (arrow (2)), from the middle-side main terminal 34 to the lower-arm-side first interconnection line 43 (arrow (3)), from a cathode electrode to an anode electrode of the lower arm diode 38, and from the lower-arm-side second interconnection line 44 to the negative-electrode-side main terminal 33 (arrow (4)). Due to this loop current, eddy current as shown by the dashed arrow flows in the respective heat dissipating layers of the upper and lower insulating layers 26. Due to the magnetic field cancellation effect, interconnection inductance in the path of the loop current is reduced.

Figure 14A:
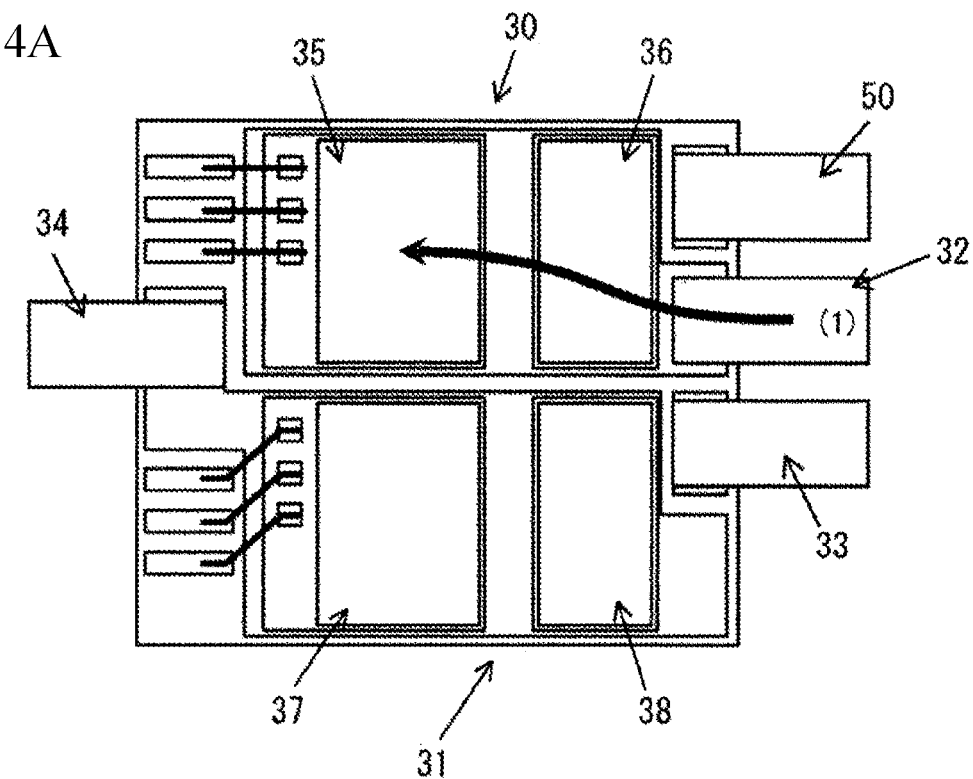
FIGS. 14(A) and 14(B) illustrate Modification Example 1 of the fourth embodiment.
Figure 14B:
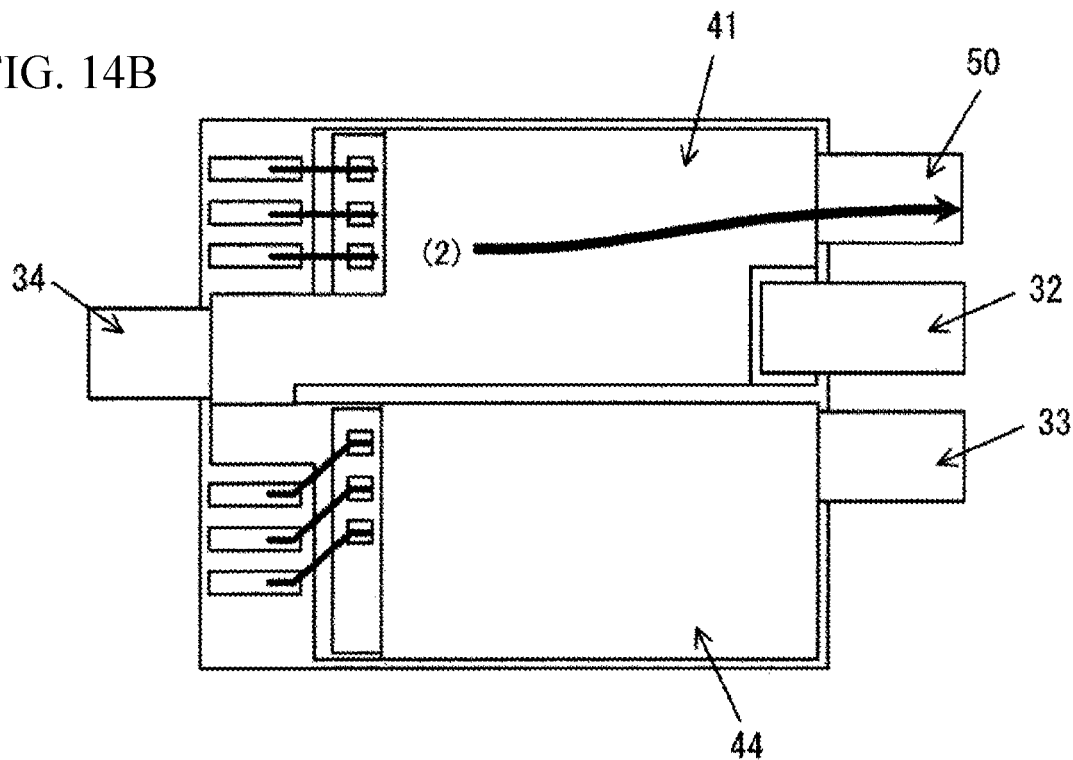
Figure 15A:
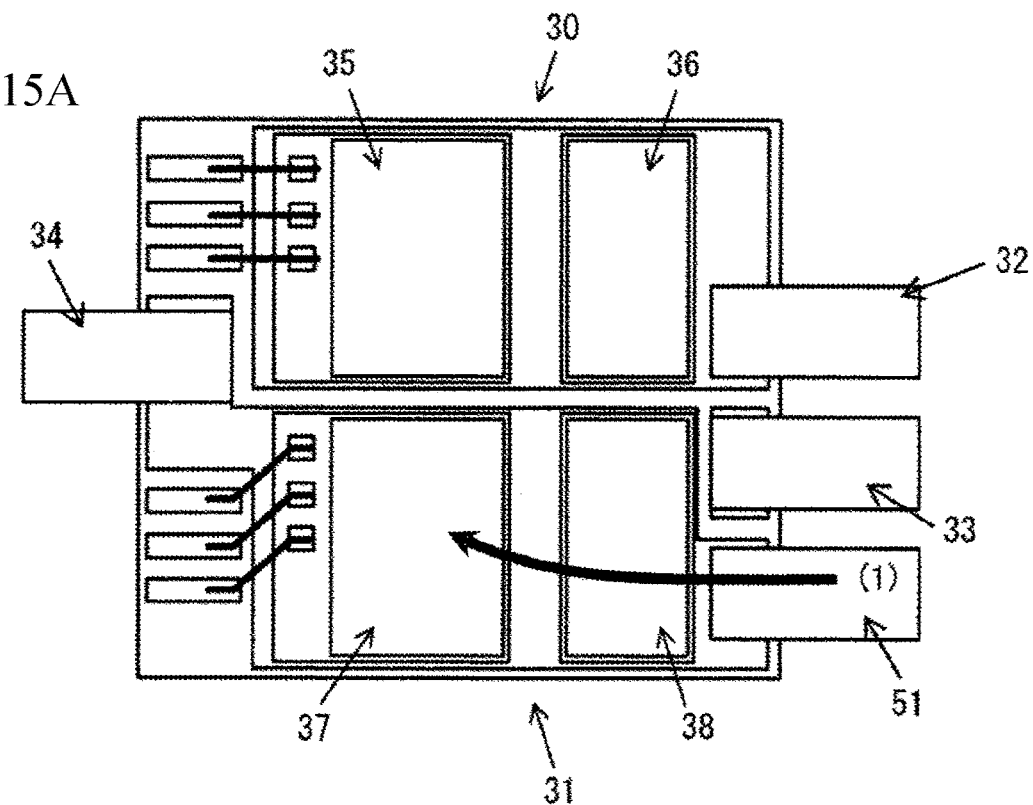
FIGS. 15(A) and 15(B) illustrate Modification Example 2 of the fourth embodiment.
Figure 15B:
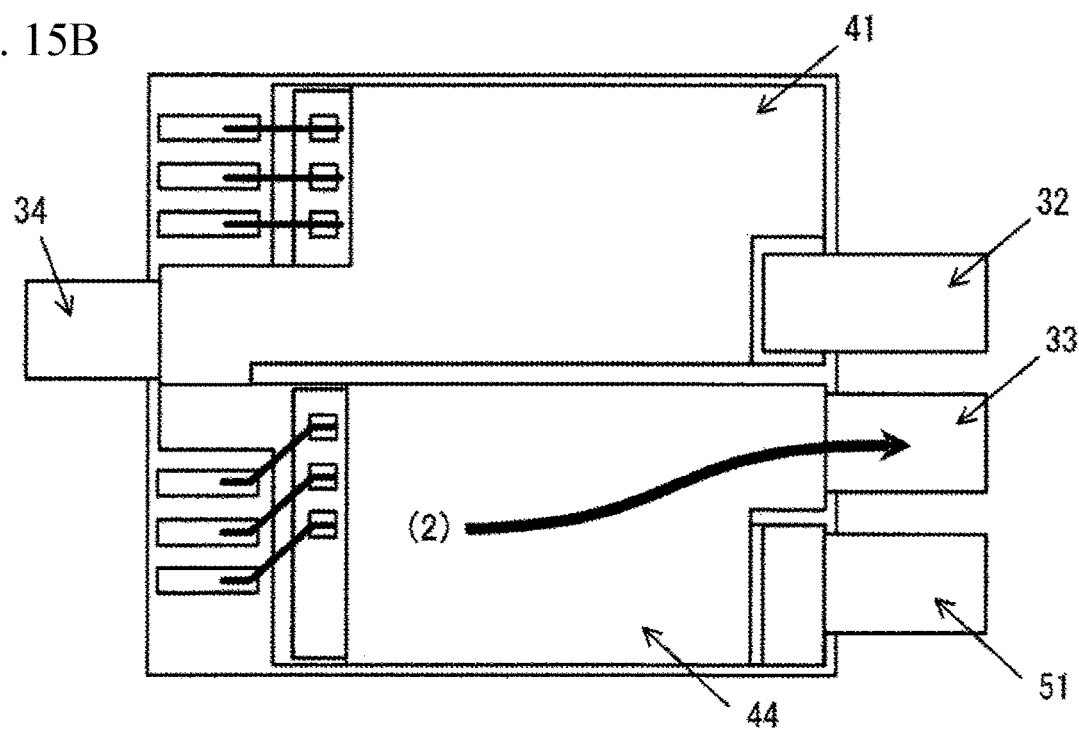

FIGS. 14(A) and 14(B) illustrate Modification Example 1 of the fourth embodiment, and FIGS. 15(A) and 15(B) illustrate Modification Example 2 of the fourth embodiment.

As illustrated in FIG. 14, a second middle-side main terminal 50 is provided beside the positive-electrode-side main terminal 32 to be close to the positive-electrode-side main terminal 32. Also, as illustrated in FIG. 15, a second middle-side main terminal 51 is provided beside the negative-electrode-side main terminal 33 to be close to the negative-electrode-side main terminal 33. Thus, due to a counter current effect as well as the eddy current effect, interconnection inductance can be reduced. For example, in a case in which the upper arm IGBT 35 is in an on state while the lower arm IGBT 37 is in an off state, current in opposite current directions flows as illustrated by the solid arrows (1) and (2) in FIGS. 14(A) and 14(B). That is, the side surface of the positive-electrode-side main terminal 32 and the side surface of the second middle-side main terminal 50 are close to and opposed to each other, and the principal surface of the upper-arm-side second interconnection line 41 and the principal surface of the upper-arm-side first interconnection line 40 are close to and opposed to each other, and magnetic fields generated by current flowing respectively are cancelled, and interconnection inductance is reduced. For example, in a case in which the upper arm IGBT 35 is in an off state while the lower arm IGBT 37 is in an on state, current in opposite current directions flows as illustrated by the solid arrows (1) and (2) in FIGS. 15(A) and 15(B), and interconnection inductance is reduced due to a similar effect to that in FIG. 14. Meanwhile, since the middle-side main terminal 34 functions as electric connection between the upper and lower arms, no interconnection lines or electric parts are connected to the middle-side main terminal 34.

As described above, according to the present embodiment, interconnection inductance can effectively be reduced. As a result, recovery surge can be restricted, and a snubber circuit can be reduced in size or omitted, which is advantageous to size reduction and high density of a power conversion device. Also, since the main terminal arrangement in FIGS. 13 to 15 can arbitrarily be selected in accordance with the layout inside the power conversion device, design margin is improved.

Here, a third interconnection line (illustration omitted) insulated from the upper-arm-side second interconnection line 41 can be formed at a position of the upper insulating layer 26 corresponding to the positive-electrode-side main terminal 32 and can be connected via the bonding material 13 to the positive-electrode-side main terminal 32, and heat caused by self-heating of the positive-electrode-side main terminal 32 and heat caused by heat generation of interconnection lines and electric parts connected to the positive-electrode-side main terminal 32 can be cooled via the upper insulating layer 26. Thus, higher cooling performance can be achieved.

Control electrodes of the IGBTs of the respective arms are connected to upper arm control terminals 42 and lower arm control terminals 46 by means of a wire bonding method using wire interconnection lines.

Figure 16A:
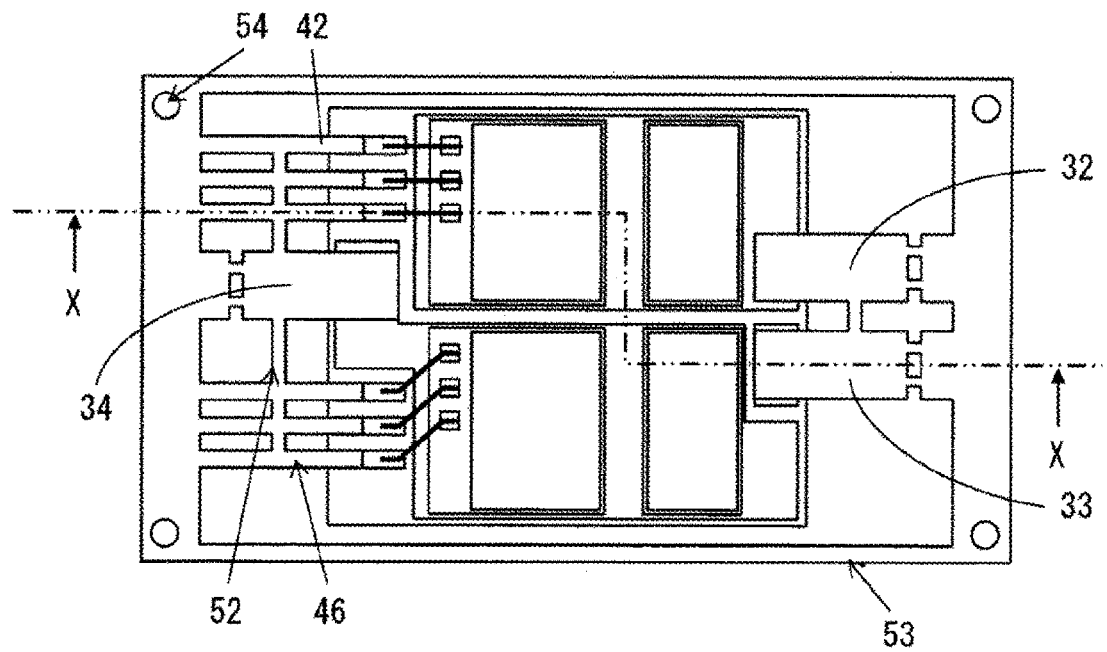
FIGS. 16(A) and 16(B) illustrate a lead frame according to the fourth embodiment.
Figure 16B:
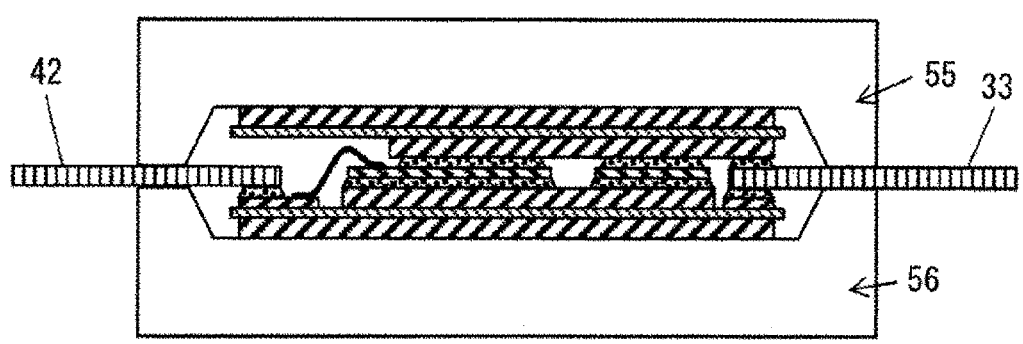

FIGS. 16(A) and 16(B) illustrate a lead frame according to the fourth embodiment. FIG. 16(A) is an upper view, and FIG. 16(B) is a cross-sectional view along the line X-X.

As illustrated in FIG. 16, control terminals of the respective arms can be connected to the upper arm control terminals 42 and the lower arm control terminals 46 via bonding materials (not illustrated) in the same process as connection of the respective main terminals and the respective interconnection lines with use of a lead frame 53 via a tie bar 52. This enables positioning means to be simplified and enables the process to be shortened. Thereafter, by cutting the tie bar 52, the positive-electrode-side main terminal 32, the negative-electrode-side main terminal 33, the middle-side main terminal 34, the upper arm control terminals 42, and the lower arm control terminals 46 can be separated from the lead frame 53. Meanwhile, a plurality of through holes 54 located at predetermined positions of the lead frame 53 can be used as guide holes for positioning and transfer in the respective processes.

In this manner, since the respective control terminals and the respective main terminals are integrated by the lead frame 53, the relative positions are accurate. At the time of clamping in the transfer molding, excessive stress is not generated in the respective terminals, detachment of the bonding material and generation of crack in the ceramic of the insulating layer 26 can be prevented, and the power semiconductor device can be provided with a high yield.

Also, as described in the first embodiment, in a case in which the respective control terminals and the respective main terminals are connected to the respective corresponding interconnection lines by means of the direct bonding method, the bonding material is not interposed, and the positional accuracy with the lower insulating layer 26 is thus improved. At the time of clamping with use of an upper die 55 and a lower die 56 as illustrated in FIG. 16(B), the yield is further improved.

Figure 17:
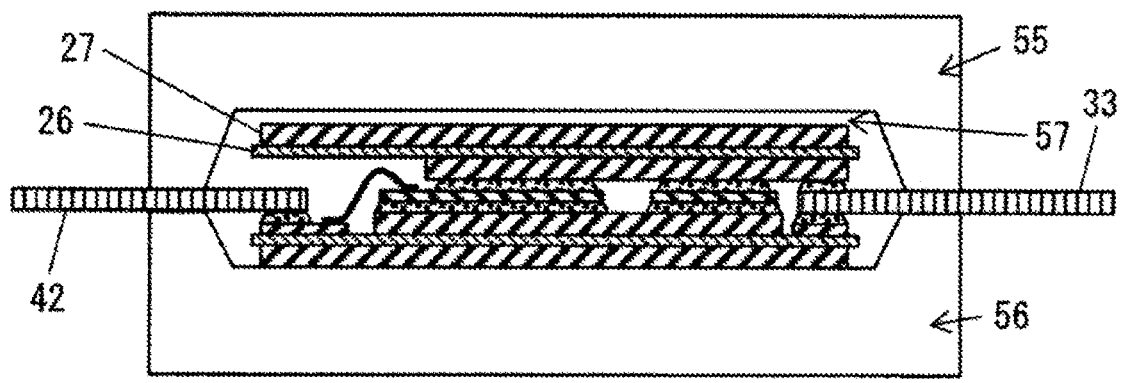
FIG. 17 illustrates clamping in the fourth embodiment.

FIG. 17 illustrates clamping in the fourth embodiment. As illustrated in FIG. 17, after a space 57 is provided to prevent the upper die 55 from contacting the heat dissipating layer 27 of the upper insulating layer 26 and is sealed with the sealing resin, the sealing resin can be polished and cut so that the upper heat dissipating layer 27 may be exposed. In this case, the number of processes is increased by one. However, since the positional accuracy of the upper insulating layer 26 is improved further than that in a conventional method, the space can be thinner, and time for polishing and cutting is shortened.

Figure 18A:
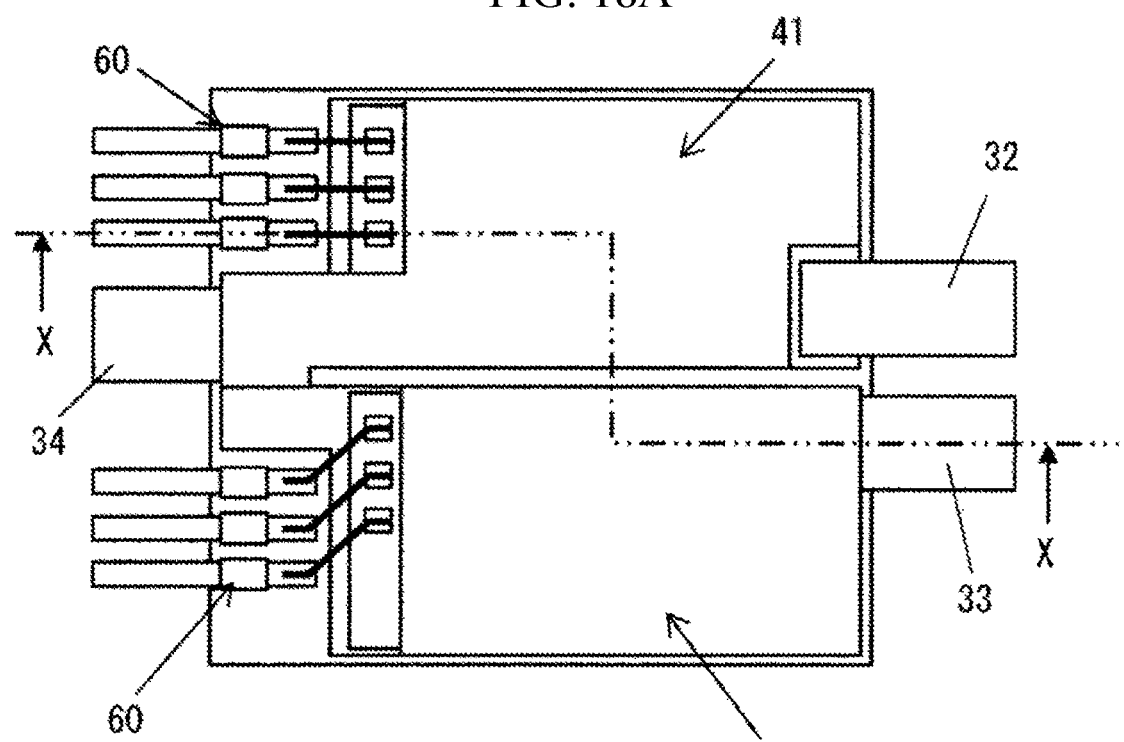
FIGS. 18(A) and 18(B) illustrate Modification Example 3 of the fourth embodiment.
Figure 18B:
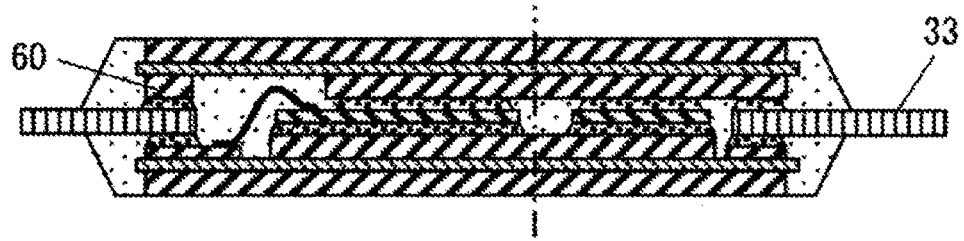

FIGS. 18(A) and 18(B) illustrate Modification Example 3 of the fourth embodiment. FIG. 18(B) is a cross-sectional view along the line X-X in FIG. 18(A).

As illustrated in FIGS. 18(A) and 18(B), at a position of the upper insulating layer 26 corresponding to the control terminal of each arm, a control third interconnection line 60 insulated from the upper-arm-side second interconnection line 41 and/or the lower-arm-side second interconnection line 44 is formed and is connected via the bonding material to at least one control terminal of each arm. Accordingly, heat caused by self-heating of the control terminal of each arm and heat caused by heat generation of interconnection lines and electric parts connected to the control terminal of each arm can be cooled via the upper insulating layer 26. Thus, higher cooling performance can be achieved.

Figure 19A:
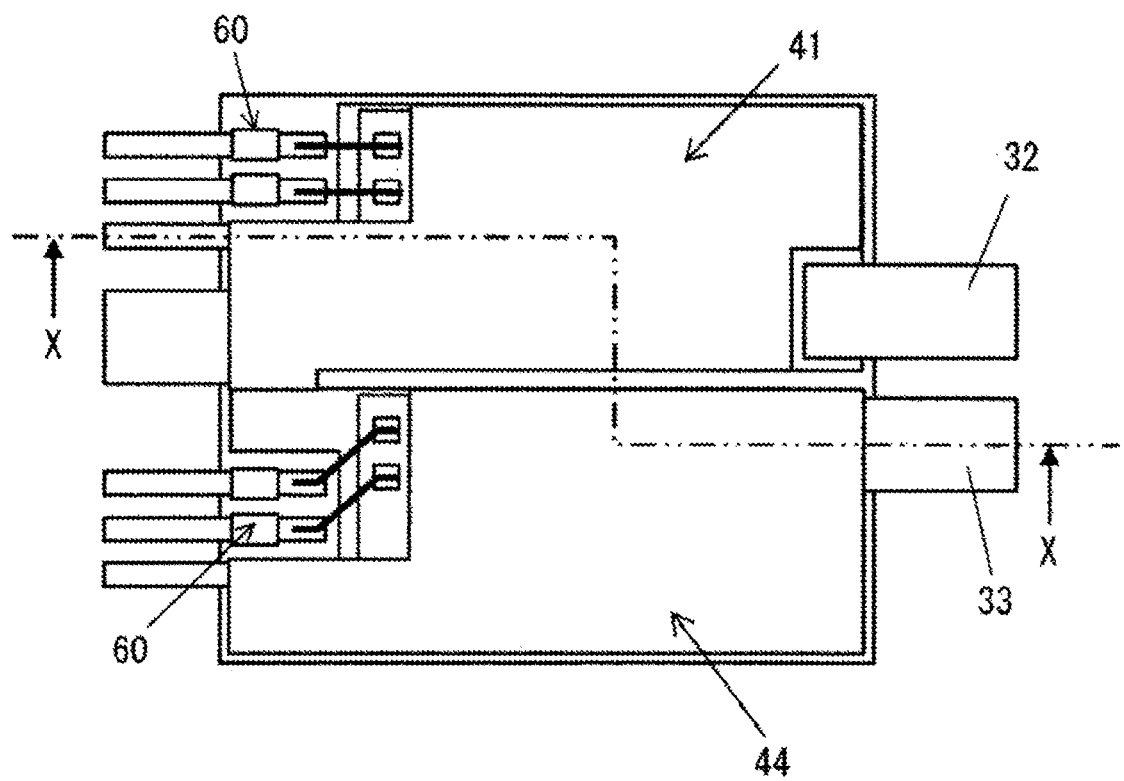
FIGS. 19(A) and 19(B) illustrate Modification Example 4 of the fourth embodiment.
Figure 19B:
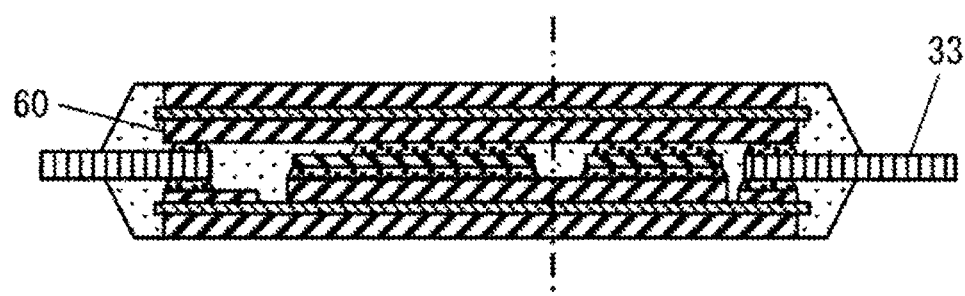

FIGS. 19(A) and 19(B) illustrate Modification Example 4 of the fourth embodiment. FIG. 19(B) is a cross-sectional view along the line X-X in FIG. 19(A).

As illustrated in FIGS. 19(A) and 19(B), some of the control third interconnection lines 60 are electrically connected to the upper-arm-side second interconnection line 41 or the lower-arm-side second interconnection line 44. Thus, since the control third interconnection lines 60 can be used as control emitters (control sources in a case of a MOSFET), and the number of the control electrodes and the number of the wire interconnection lines in the power semiconductor device can be reduced, the power semiconductor device can be provided at low cost. Also, since the areas of the upper-arm-side second interconnection line 41 and the lower-arm-side second interconnection line 44 can be enlarged, cooling performance can drastically be improved, which is advantageous in size reduction and high density of a power conversion device.

Also, since the respective interconnection lines of the upper insulating layer 26 are connected not only to the power semiconductor element but also to the main terminals and the control terminals around the connection parts to the power semiconductor element, the number of bonding parts increases. However, since the positional accuracy of the respective terminals is favorable, the positional accuracy of the upper insulating layer 26 is also improved, and the upper insulating layer 26 is hardly inclined. That is, since the parallelism between the principal surface of the power semiconductor element and the principal surface of the insulating layer 26 is secured, thickness variation and flow (leakage) of the bonding material of the upper electrode can be restricted, and the yield is improved.

As described above, according to the present embodiment, the power semiconductor device more excellent in size reduction and heat dissipation and much more excellent in interconnection inductance reduction than those according to the first to third embodiments can be provided with a high yield.

Fifth Embodiment

Figure 20A:
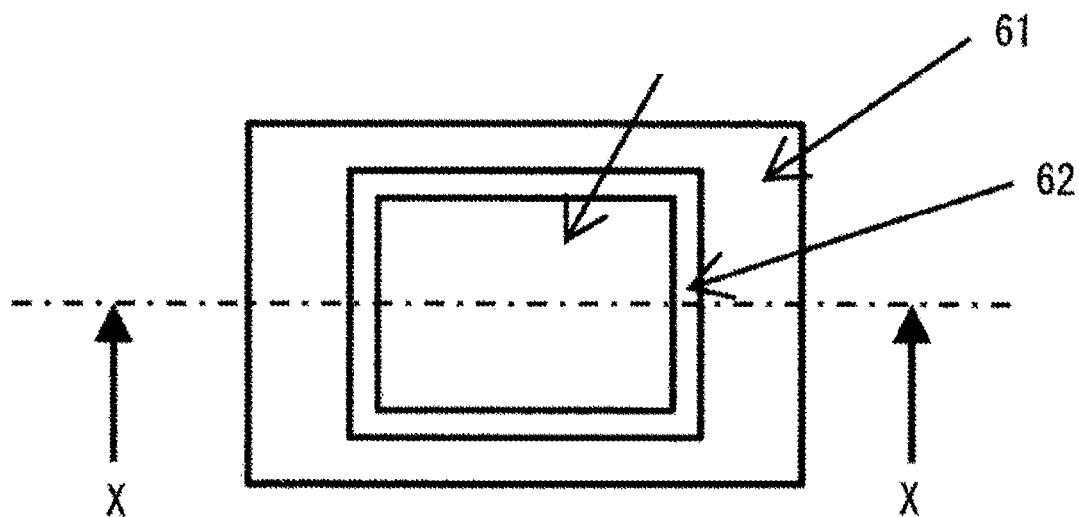
FIGS. 20(A) and 20(B) illustrate a fifth embodiment.
Figure 20B:
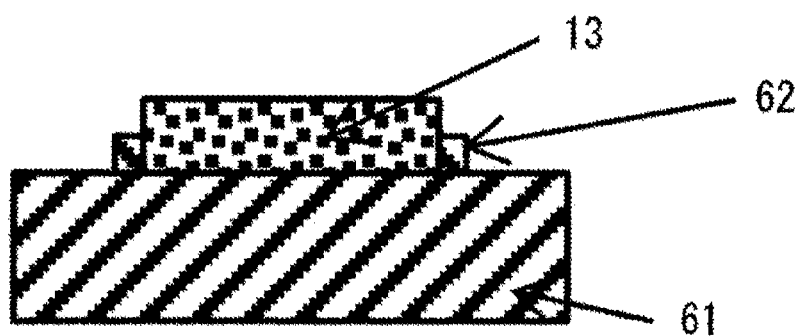

FIGS. 20(A) and 20(B) illustrate a fifth embodiment. FIG. 20(B) is a cross-sectional view along the line X-X in FIG. 20(A).

In the present embodiment, as illustrated in FIG. 20, since a regulating portion 62 is formed at a predetermined position of each interconnection line and/or each terminal 61 provided with the bonding material 13, flow of the bonding material 13 can be prevented, and thickness variation of the bonding material 13 can be reduced.

The regulating portion 62 can be formed in a known method such as employing a photolithographic method with use of a photosensitive resin such as photosensitive solder resist and photosensitive polyimide and applying a thermosetting resin by means of screen printing or with use of a dispenser and hardening the resin. Also, in a case in which solder is used as the bonding material 13, the regulating portion 62 can be formed by attaching a mask at a predetermined position and performing surface roughening by means of wet etching or sandblasting.

Meanwhile, although the regulating portion 62 illustrated in FIG. 20 is formed only in the vicinity of the outer circumference of the bonding material 13, the present invention is not limited to this. For example, by extending and forming an insulating material, regardless of whether the insulating material is organic or inorganic, at a predetermined position, insulation performance of the interconnection line and the terminal 61 having different potential can be enhanced. Also, by employing a polyamide resin as the regulating portion 62 or roughening the regulating portion 62 and forming the regulating portion 62 at a region except a region opposed to the bonding material of each interconnection line and each terminal 61, adhesion to the sealing resin can be improved.

The present embodiment can be combined with the other embodiments.

Sixth Embodiment

FIGS. 21(A) to 21(E) illustrate a sixth embodiment.

In the present embodiment, the connection method from the control electrode to the control terminal in the fourth embodiment is changed. It is to be noted that the other configuration is similar to that of the fourth embodiment, and that description thereof is omitted.

Figure 21A:
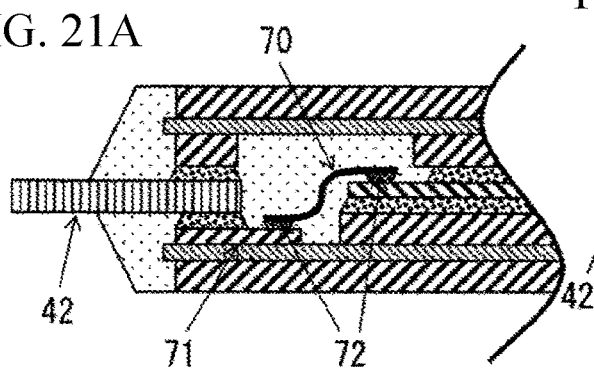
FIGS. 21(A) to 21(E) illustrate a sixth embodiment.

In FIG. 21(A), the wire interconnection line is replaced with a flexible printed wiring board (hereinbelow referred to as an FPC) 70, and the control electrode of the power semiconductor element and a control interconnection line 71 are connected via an interconnection line of the FPC 70 and bonding materials 72. Bumps can be used as the bonding materials 72, for example. The bumps are formed on the control electrode and either the control interconnection line 71 or an interconnection pad (illustration omitted) of the FPC 70 in advance and are connected by means of ultrasonic welding. The bumps can be formed by electroplating or electroless-plating a metal consisting primarily of solder, Ni, Au, or the like or printing conductive paste, solder paste, or the like.

Further, since the bonding materials 72 can be made of the same material as that for the bonding material 13 on the upper electrode of the power semiconductor element and that for the bonding material 13 on the control interconnection line 71, the connection processes can be integrated, and the number of processes can be reduced.

Figure 21B:
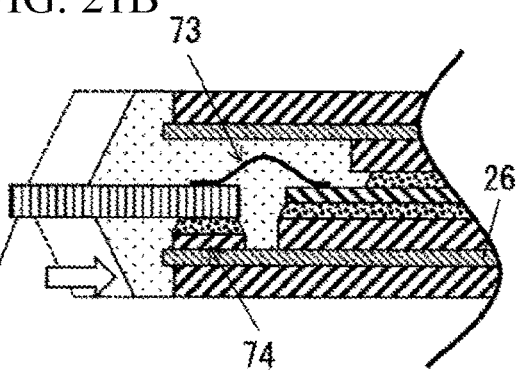

In FIG. 21(B), a destination to which a wire interconnection line 73 is connected is the control terminal 42 instead of the control interconnection line. As a result, the length of the control interconnection line can be shortened, and the size of the power semiconductor device can thus be reduced as compared with the size in FIG. 21(A) shown by the dashed line. Meanwhile, an interconnection line on the lower insulating layer 26 corresponding to the control interconnection line in FIG. 21(A) functions as a control third interconnection line 74.

Figure 21C:
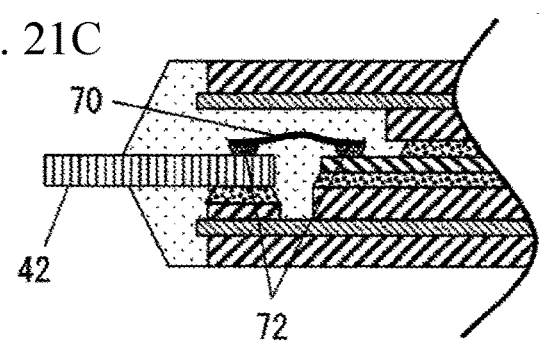

In FIG. 21(C), FIGS. 21(A) and 21(B) are combined. The wire interconnection line is replaced with the FPC 70, and the control electrode and the control interconnection line are connected via the interconnection line of the FPC 70 and bonding materials 72. Consequently, the effects of FIGS. 21(A) and 21(B) are exerted.

Figure 21D:
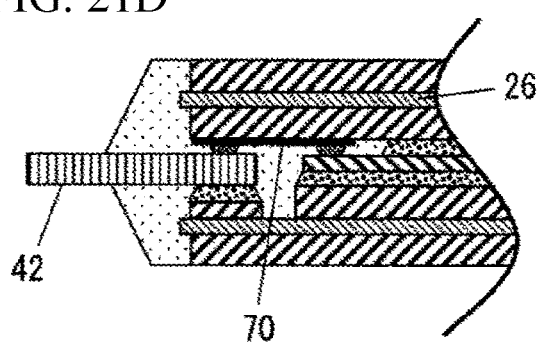

In FIG. 21(D), the FPC 70 is used in a similar manner to FIG. 21(A), and the FPC 70 is secured to the interconnection line of the upper insulating layer 26. Thus, since the FPC 70 is positioned to the interconnection line in advance, only the insulating layer 26 needs to be positioned, and the size of the power semiconductor device can be reduced in a similar manner to FIG. 21(B).

Meanwhile, instead of the FPC 70, an insulating layer equivalent to the base material of the FPC 70 may be provided on the interconnection line of the insulating layer 26 to form an interconnection line equivalent to the interconnection line of the FPC 70. By using the regulating portion 62 described in the fifth embodiment for the interconnection line equivalent to the interconnection line of the FPC 70, the material cost and the number of processes can be reduced.

Figure 21E:
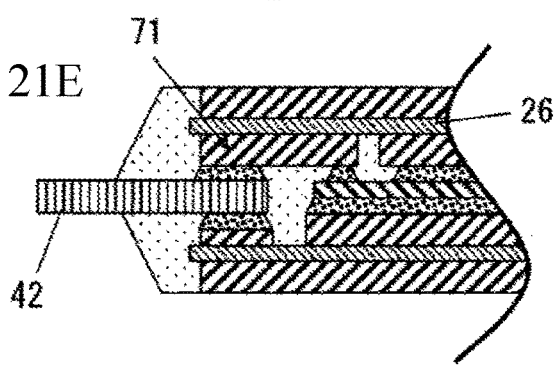

In FIG. 21(E), instead of the wire interconnection line or the FPC, the control interconnection line 71 is provided on the upper insulating layer 26. Since the wire interconnection line or the FPC is dispensed with, further cost reduction can be achieved. That is, in the present example, the second interconnection layer 15 of the upper insulating layer 26 and the control interconnection line 71 can be formed at the same time, and the wire interconnection line or the FPC can be dispensed with. Also, since the control electrode of the power semiconductor element and the upper electrode, and the second interconnection layer 15 and the control interconnection line 71, can be connected via the same bonding material in the same process, the number of processes can be reduced. Further, since the control interconnection line 71 and the control terminal 42 can also be connected via the same bonding material in the same process, the number of processes can further be reduced. Also, since the interconnection lines can be formed in the same process and can be connected via the same bonding material, positioning means can be simplified, and positional accuracy of the respective terminals is improved.

The present embodiment can be combined with the other embodiments.

Seventh Embodiment

Figure 22A:
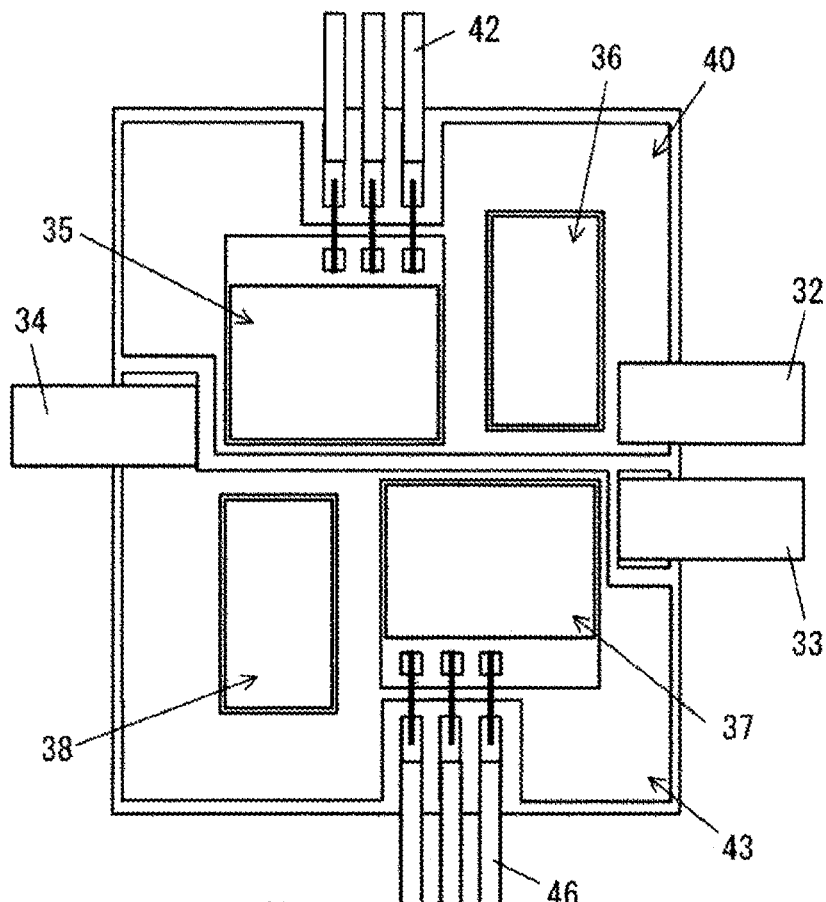
FIGS. 22(A) and 22(B) illustrate a seventh embodiment.
Figure 22B:
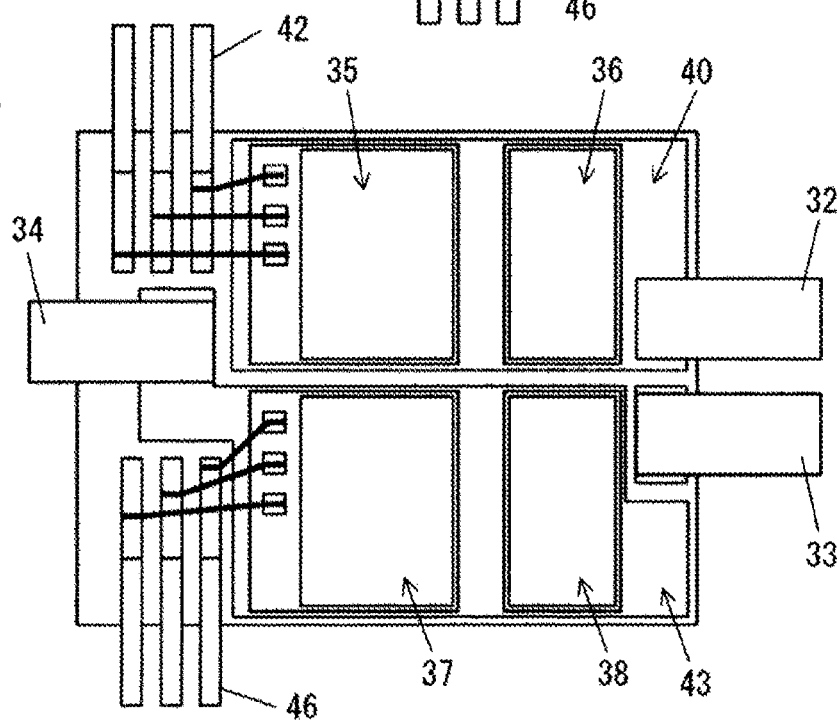

FIGS. 22(A) and 22(B) illustrate a seventh embodiment.

In the present embodiment, a power semiconductor device in which the leading directions of the control terminals and the main terminals are changed is provided. FIGS. 22(A) and 22(B) illustrate a specific embodiment. It is to be noted that FIGS. 22(A) and 22(B) are based on the fourth embodiment and are upper views in which the sealing resin, the upper insulating layer 26, and the upper bonding material are removed to facilitate understanding in a similar manner to FIG. 13(A). The other configuration is similar to that of the fourth embodiment, and description thereof is thus omitted. Meanwhile, the present embodiment is not limited to this and can be carried out by combining the present embodiment with the first to third embodiments.

In FIGS. 22(A) and 22(B), the positive-electrode-side main terminal 32, the negative-electrode-side main terminal 33, and the middle-side main terminal 34 are led from opposed paired sides, and the upper arm control terminals 42 and the lower arm control terminals 46 are led from paired sides perpendicular to the leading directions of these main terminals. In this manner, by changing arrangement of the power semiconductor element and changing the leading directions of the respective terminals, the leading directions of the respective terminals can arbitrarily be set in accordance with the layout of the components of the power semiconductor device. By using the insulating layer 26 as in the present embodiment although this is not illustrated in the figure, the control interconnection lines can be formed inside the insulating layer 26 freely. Thus, for example, the respective control terminals of the upper and lower arms can be provided on one side of the power semiconductor device.

Figure 23A:
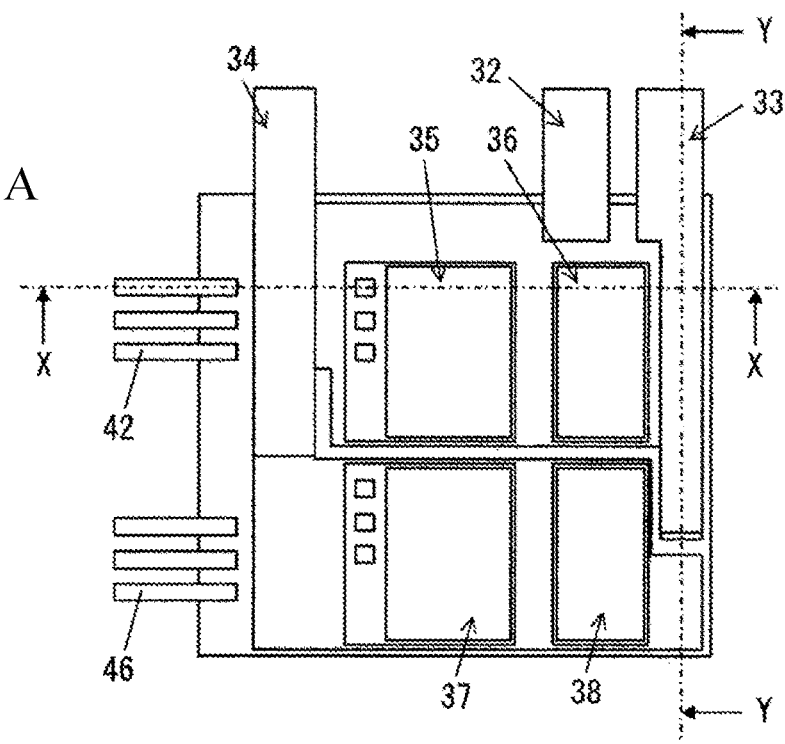
FIGS. 23(A) to 23(C) illustrate Modification Example of the seventh embodiment.
Figure 23B:
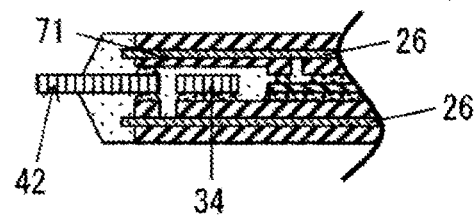
Figure 23C:
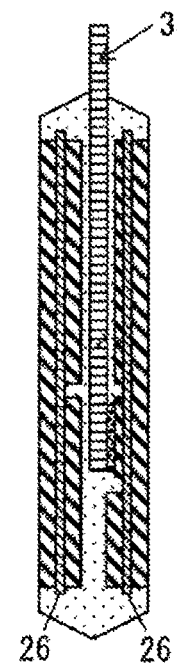

FIGS. 23(A) to 23(C) illustrate Modification Example of the seventh embodiment.

It is to be noted that FIGS. 23(A) to 23(C) are based on the fourth embodiment and are upper views in which the sealing resin, the upper insulating layer 26, and the upper bonding material are removed to facilitate understanding in a similar manner to FIG. 13(A). The other configuration is similar to that of the fourth embodiment, and description thereof is thus omitted.

FIG. 23(B) is a cross-sectional view along the line X-X in FIG. 23(A), and FIG. 23(C) is a cross-sectional view along the line Y-Y in FIG. 23(A).

As illustrated in FIGS. 23(A) to 23(C), for example, by extending the middle-side main terminal 34 and the negative-electrode-side main terminal 33 from the connection portion thereof to the bonding material between the upper and lower insulating layers 26, the respective main terminals can be provided on one side of the power semiconductor device. In this manner, even in a case in which the distance from the connection portion of the main terminal to the leading portion of the sealing resin (portion at which the main terminal is clamped by the die) is long, the positional accuracy of the main terminal is improved further than in the conventional case by employing the present embodiment. Accordingly, at the time of clamping, excessive stress is not generated in the respective terminals, detachment of the bonding material and generation of crack in the ceramic of the insulating layer 26 can be prevented, the power semiconductor device can be provided with a high yield, and the design freedom of the internal layout of the power semiconductor device can be improved.

The embodiments of the power semiconductor device have been described above. For example, the present invention can be applied to a power semiconductor device constituting a two-phase full bridge (4IN1) or a three-phase full bridge (6IN1) obtained by preparing a plurality of one-phase circuits each constituted by the upper and lower arms illustrated in FIG. 13 and integrating the one-phase circuits inside the sealing resin. By applying the present invention to such a power semiconductor device in which the number of main terminals and control terminals is increased, the effect of the present invention is further enhanced.

Eighth Embodiment

Figure 24A:
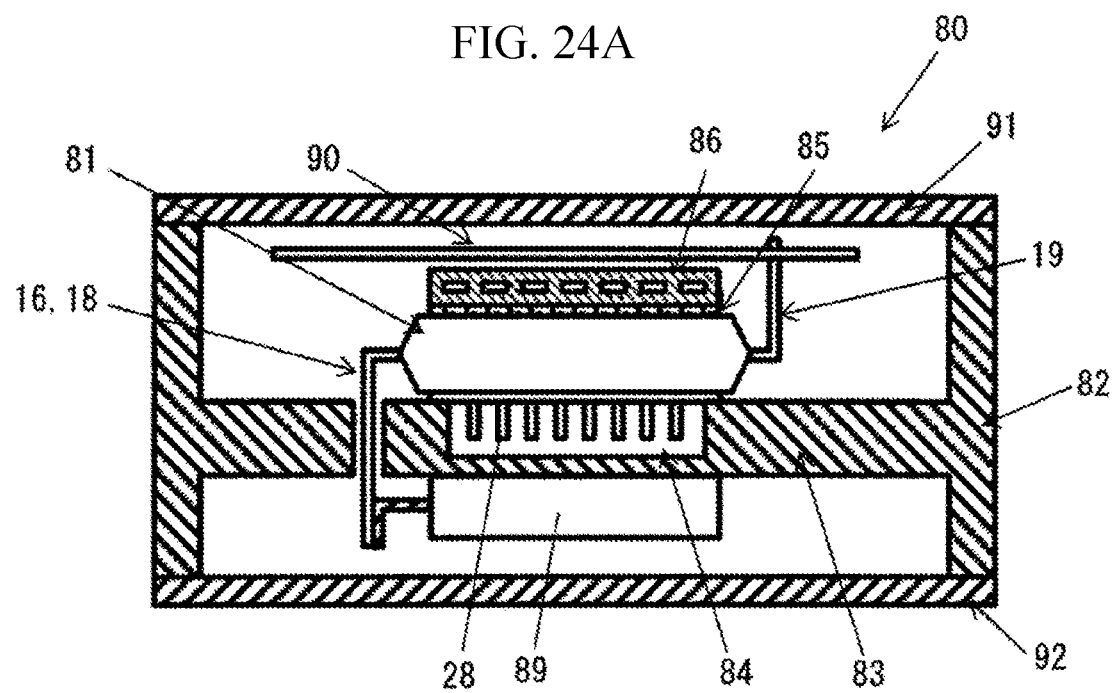
FIGS. 24(A) and 24(B) illustrate an eighth embodiment.
Figure 24B:
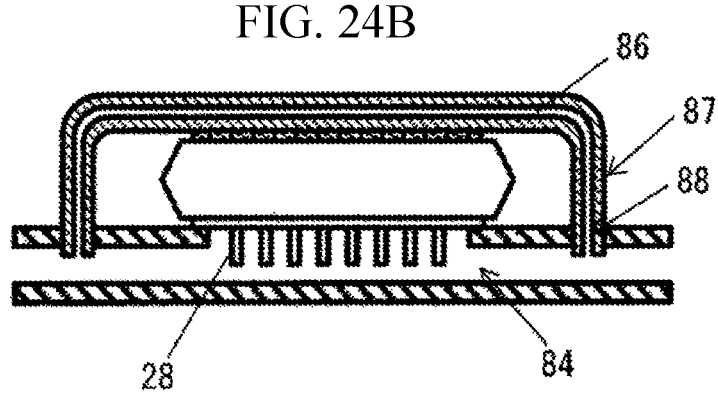

FIGS. 24(A) and 24(B) illustrate an eighth embodiment. In the present embodiment, a power conversion device incorporating a power semiconductor device is described.

FIG. 24(A) is a cross-sectional view on one side surface of a power conversion device 80, and FIG. 24(B) is a cross-sectional view on another side surface in a perpendicular direction to the one side surface illustrating the periphery of a power semiconductor device 81.

In the present embodiment, the power semiconductor device 81 illustrated in the first embodiment or the third embodiment is used. That is, the power semiconductor device 81 is a power semiconductor device in which the upper interconnection line is exposed from the sealing resin 22, or in which the lower heat dissipating layer 27 equipped with the fin is exposed from the sealing resin 22.

The fin 28 of the power semiconductor device 81 is mounted via a sealing member (illustration omitted) such as an O ring and liquid gasket to be opposed to a lower waterway 84 integrally molded in a partition plate 83 of a case 82. Also, an upper waterway 86 is brought into close contact with the upper interconnection line of the power semiconductor device 81 via an insulating member 85 such as a heat dissipating sheet and a ceramic plate. A water supply and drainage header 87 of the upper waterway 86 is inserted in a hole 88 provided on the upper surface of the lower waterway 84 via a sealing member (illustration omitted) such as an O ring and liquid gasket in a watertight manner. Also, the upper waterway 86 is secured to the partition plate 83 by means of screwing or by a tightening member (illustration omitted) such as a spring clip. In this manner, the power semiconductor device 81 is cooled from both the upper surface and the lower surface.

Also, the main terminals 16 and 18 of the power semiconductor device 81 are bent downward to pass through a through hole of the partition plate 83 and are connected to terminals of another electric part 89 such as a smoothing capacitor and a reactor mounted on the lower surface of the lower waterway 84 by means of screwing, welding, or the like. Further, the control terminal 19 of the power semiconductor device is bent upward and is connected to a control substrate 90 secured to a supporting member (illustration omitted) such as a shield plate and a mounting boss by means of press fit, soldering, or the like. In this manner, the other electric part 89 can be cooled by the lower waterway 84, and heat interference with the other electric part 89 from the power semiconductor device 81, having a relatively large amount of heat generation, can be restricted since the lower waterway 84 is interposed between the other electric part 89 and the power semiconductor device 81. Similarly, the control substrate 90 can be cooled by the upper waterway 86, and heat interference can be restricted. Although illustration is omitted, computing devices such as a CPU and a DSP implemented on the control substrate 90 can be restricted from heat interference, can be thermally coupled with the upper waterway 86 via a heat dissipating member, and can be cooled.

The case 82 houses not-illustrated components constituting the power conversion device 80 such as a current sensor, a discharge resistor, and a filter via an upper cover 91, a lower cover 92, and a sealing member (illustration omitted) such as an O ring and liquid gasket in a watertight manner.

Meanwhile, one power semiconductor device 81 is used in the present embodiment for convenience. In a case of the power conversion device 80 driving a three-phase blushless motor, six one-arm (1IN1) power semiconductor devices 81, three one-phase bridge (2IN1) power semiconductor devices 81, or one three-phase full bridge (6IN1) power semiconductor device 81 can be used. Also, in a case of a series resonant full ridge voltage conversion device, four one-arm (1IN1) power semiconductor devices 81 or one two-phase full bridge (4IN1) power semiconductor device 81 can be used. The arm configuration of the power semiconductor device 81 can freely be set in accordance with the main circuit configuration of the power conversion device 80.

According to the aforementioned embodiments, the following effects can be obtained.

(1) The power semiconductor device 81 includes the semiconductor element 11 including the upper electrode 14 and the lower electrode, the first interconnection layer 12 arranged to be opposed to the lower electrode of the semiconductor element 11 and connected to the lower electrode of the semiconductor element 11 via the bonding material 13, the second interconnection layer 15 arranged to be opposed to the upper electrode 14 of the semiconductor element 11 and connected to the upper electrode 14 of the semiconductor element 11 via the bonding material 13, the first main terminal 18 connected to the first interconnection layer 12 via the bonding material 13, the second main terminal 16 connected to the second interconnection layer 15 via the bonding material 13, and the spacer 17, wherein the spacer 17 is arranged to be parallel to the first interconnection layer 12 or the second interconnection layer 15 and is provided with the first main terminal 18 or the second main terminal 16. Accordingly, breakage of the power semiconductor device in the production process can be prevented.

The present invention is not limited to the above embodiments, and other embodiments conceivable within the scope of the technical idea of the present invention are included within the scope of the present invention without impairing the characteristics of the present invention. Also, the above embodiments and the plurality of modification examples may be combined.

REFERENCE SIGNS LIST 11 power semiconductor element
12 first interconnection layer
13 bonding material
15 second interconnection layer
16 second main terminal
17 spacer
18 first main terminal
19 control terminal
20 wire interconnection line
22 sealing resin
24 third interconnection layer
26 insulating layer
27 heat dissipating layer
28 fin
30 upper arm
31 lower arm
35 upper arm IGBT
36 upper arm diode
37 lower arm IGBT
38 lower arm diode
80 power conversion device
81 power semiconductor device
86 upper waterway
84 lower waterway

The invention claimed is:
1. A power semiconductor device comprising:
a semiconductor element including an upper electrode and a lower electrode;
a first interconnection layer arranged to be opposed to the lower electrode of the semiconductor element and connected to the lower electrode of the semiconductor element via a bonding material;
a second interconnection layer arranged to be opposed to the upper electrode of the semiconductor element and connected to the upper electrode of the semiconductor element via the bonding material;
a first main terminal connected to the first interconnection layer via the bonding material;
a second main terminal connected to the second interconnection layer via the bonding material; and
a spacer that is arranged to be parallel to the first interconnection layer or the second interconnection layer,
wherein the first main terminal or the second main terminal comprises:
a first portion positioned to be in contact with the spacer and one of the first interconnection layer or the second interconnection layer, such that the first portion of the first main terminal or the second main terminal is disposed between the spacer and the one of the first interconnection layer or the second interconnection layer in a recess of the spacer, and
a second portion positioned to extend beyond a sealed body of the power semiconductor device such that the second portion is exposed, and
wherein at least part of the second interconnection layer, the bonding material, the second main terminal and the spacer are overlapped in a direction orthogonal to a lengthwise direction of the second main terminal.

2. The power semiconductor device according to claim 1, wherein the spacer is a third interconnection layer connected via the bonding material to an opposite surface of a bonding surface between the first interconnection layer or the second interconnection layer and the first main terminal or the second main terminal.

3. The power semiconductor device according to claim 2, wherein the first interconnection layer and the third interconnection layer are separated from a lead frame.

4. The power semiconductor device according to claim 2, wherein
the first interconnection layer is connected via the bonding material to a side of the lower electrode of the semiconductor element, and the second interconnection layer is connected via the bonding material to a side of the upper electrode of the semiconductor element,
an insulating layer and a heat dissipating layer are laminated on a side of each of the first interconnection layer and the second interconnection layer opposite a bonding surface with the semiconductor element, and
an insulating layer and a heat dissipating layer are laminated on a side of the third interconnection layer opposite a bonding surface with the first main terminal or the second main terminal.

5. The power semiconductor device according to claim 1, wherein the first main terminal or the second main terminal is mounted at a predetermined position on the spacer.

6. The power semiconductor device according to claim 1, wherein the sealed body comprises a sealing resin configured to enclose the semiconductor element and the first portion of the first main terminal or the second main terminal.

7. The power semiconductor device according to claim 6, wherein a cross-section of the sealed body including the sealing resin is structured to form a hexagonal shape.

8. The power semiconductor device according to claim 1, wherein the at least part of the second interconnection layer, the bonding material, the second main terminal and the spacer are overlapped in order of the second interconnection layer, the bonding material, the second main terminal and the spacer.

* * * * *